United States Patent
Ha

(10) Patent No.: US 10,600,956 B2
(45) Date of Patent: Mar. 24, 2020

(54) ELECTRONIC DEVICE AND METHOD FOR FABRICATING THE SAME

(71) Applicant: SK hynix Inc., Icheon-si (KR)

(72) Inventor: Ga-Young Ha, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/961,486

(22) Filed: Apr. 24, 2018

(65) Prior Publication Data

US 2019/0036014 A1    Jan. 31, 2019

(30) Foreign Application Priority Data

Jul. 25, 2017 (KR) .................. 10-2017-0094028

(51) Int. Cl.
*H01L 43/08* (2006.01)
*H01L 43/12* (2006.01)
*H01L 43/10* (2006.01)
*H01L 43/02* (2006.01)

(52) U.S. Cl.
CPC .............. *H01L 43/08* (2013.01); *H01L 43/12* (2013.01); *H01L 43/02* (2013.01); *H01L 43/10* (2013.01)

(58) Field of Classification Search
None
See application file for complete search history.

(56) References Cited

U.S. PATENT DOCUMENTS

| 5,607,599 A | 3/1997 | Ichihara et al. |
| 2013/0062714 A1* | 3/2013 | Zhu .................. G11C 11/16 257/421 |
| 2014/0070290 A1* | 3/2014 | Inumiya .............. H01L 43/10 257/295 |
| 2014/0287535 A1* | 9/2014 | Kim .................. H01L 45/1675 438/3 |
| 2017/0025599 A1* | 1/2017 | Kim .................. H01L 43/08 |

FOREIGN PATENT DOCUMENTS

| KR | 10-2013-0015564 | 2/2013 |
| KR | 10-2016-0093512 | 8/2016 |

* cited by examiner

*Primary Examiner* — Moazzam Hossain
*Assistant Examiner* — Stanetta D Isaac
(74) *Attorney, Agent, or Firm* — Perkins Coie LLP

(57) ABSTRACT

An electronic device is provided to include a semiconductor memory which includes one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon.

16 Claims, 22 Drawing Sheets

ELECTRONIC DEVICE AND METHOD FOR FABRICATING THE SAME

CROSS-REFERENCE TO RELATED APPLICATION

This patent document claims priority of Korean Patent Application No. 10-2017-0094028, entitled "ELECTRONIC DEVICE AND METHOD FOR FABRICATING THE SAME" and filed on Jul. 25, 2017, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is a demand for electronic devices capable of storing information in various electronic devices or appliances such as a computer, a portable communication device, and so on, and research and development for such electronic devices have been conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device, in which an electronic device includes a semiconductor memory which can improve characteristics of a variable resistance element.

In one aspect, an electronic device may include a semiconductor memory, and the semiconductor memory may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon.

Implementations of the above electronic device may include one or more the following.

The sidewall spacer may include a boron-doped amorphous silicon. The sidewall spacer may include a germanium-inserted amorphous silicon. The amorphous silicon may be a low temperature amorphous silicon which is deposited at a temperature from 150° C. to 400° C. The semiconductor memory may further include a first additional sidewall spacer disposed between the sidewall spacer and the variable resistance element and including a metal oxide. The metal oxide may include an oxide of a metal including Hf, Fe, Al, Mg, Zr, Nb, Mo, Ta, W, or Ti, or a combination thereof. The semiconductor memory may further include a second additional sidewall spacer disposed between the sidewall spacer and the first additional sidewall spacer and including a silicon oxide, a silicon nitride or a combination thereof. The semiconductor memory may further include another sidewall spacer disposed between the sidewall spacer and the variable resistance element and including a silicon-containing metal oxide. The silicon-containing metal oxide may include a metal including Hf, Fe, Al, Mg, Zr, Nb, Mo, Ta, W, or Ti, or a combination thereof. The variable resistance element may have a boron content in sidewalls due to a presence of boron ions in the boron-doped amorphous silicon included in the sidewall spacer. A sidewall of the variable resistance element may have a boron content in sidewalls because germanium included in the third spacer blocks boron out-diffusion. The variable resistance element may further include a lower electrode disposed at a lowest portion of the variable resistance element, and the lower electrode may include an upper portion and a lower portion, the upper portion having sidewalls which are aligned with the MTJ structure and the lower portion having a greater width than a width of the upper portion and having sidewalls which are not aligned with the upper portion.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

In another aspect, a method for fabricating an electronic device may include forming a Magnetic Tunnel Junction (MTJ) structure over a substrate, the MTJ structure forming a part of a variable resistance element and including a free layer having a changeable magnetization direction, a pinned layer having a fixed magnetization direction and a tunnel barrier layer interposed between the free layer and the pinned layer; and forming a third spacer including an amorphous silicon on sidewalls of the variable resistance element.

Implementations of the above method may include one or more the following.

The forming of the third spacer may include depositing an amorphous silicon at a temperature from 150° C. to 400° C. The forming of the third spacer may include performing a deposition process using a reactive gas including $SiCl_4$, $SiH_4$, or $Si_2H_4$ or a combination thereof. The forming of the third spacer may include depositing a boron-doped amorphous silicon. The forming of the third spacer may include performing a deposition process using a reactive gas including $BCl_3$, $B_2H_6$, $SiCl_4$, $SiH_4$, or $Si_2H_4$ or a combination thereof. The forming of the third spacer may include depositing a germanium-inserted amorphous silicon. The forming of the third spacer may include performing a deposition process using a reactive gas including $GeH_4$, $SiCl_4$, $SiH_4$, $Si_2H_4$ or a combination thereof. The forming of the MTJ structure may include forming an MTJ structure pattern by selectively etching the MTJ structure, wherein, the forming of the MTJ structure pattern may include forming an initial spacer on sidewalls of the MTJ structure pattern, the initial spacer including a metal. The method may further include performing an oxidation process on the initial spacer to convert the initial spacer into a first spacer including a metal oxide. The metal oxide may include an oxide of a metal including Hf, Fe, Al, Mg, Zr, Nb, Mo, Ta, W, or Ti, or a combination thereof. The forming of the MTJ structure may include forming a second spacer disposed between the third spacer and the first spacer and including a silicon oxide, a silicon nitride or a combination thereof. The method may further include performing an oxidation process on the initial spacer to convert the initial spacer into a first spacer including a metal oxide, wherein, the forming of the third spacer includes converting the first spacer into a modified first spacer including a silicon-containing metal oxide. The silicon-containing metal oxide may include an oxide of a metal, the metal including Hf, Fe, Al, Mg, Zr, Nb, Mo, Ta, W, or Ti, or a combination thereof. Boron ions included in the third spacers may penetrate into the variable resistance element to increase a boron content the sidewalls of the variable resistance element. Germanium included in the third spacer may block boron out-diffusion to increase a boron content in the sidewalls of the variable resistance element. The method may further include forming a lower electrode layer under the variable resistance element, wherein the lower electrode layer may include an upper portion and a lower portion, the upper portion having sidewalls which are aligned with the MTJ structure and the lower portion having a greater width than a width of the upper portion and having sidewalls which are not aligned with the upper portion.

In further another aspect, an electronic device including a semiconductor memory is provided. The semiconductor memory may include a substrate; a first magnetic layer disposed over the substrate; a tunnel barrier layer disposed over the first magnetic layer; a second magnetic layer disposed over the tunnel barrier layer; a first sidewall spacer disposed on sidewalls of the first magnetic layer, the tunnel barrier layer and the second magnetic layer; a second sidewall spacer disposed on the first spacer; and a third sidewall spacer disposed on the second sidewall spacer and structured to exhibit a compressive stress of 0.5 to 1.5 GPa.

Implementations of the above electronic device may include one or more the following.

The first sidewall spacer may include a metal oxide or a silicon-containing metal oxide. The first sidewall spacer may include a metal including Hf, Fe, Al, Mg, Zr, Nb, Mo, Ta, W, or Ti, or a combination. The second sidewall spacer may include a silicon oxide, or a silicon nitride or a combination thereof. The third sidewall spacer may include a low temperature amorphous silicon which is deposited at a temperature from 150° C. to 400° C. The third sidewall spacer may include a boron-doped amorphous silicon or a germanium-inserted amorphous silicon. The first magnetic layer, the tunnel barrier layer and the second magnetic layer may have a boron content which increases from a center portion toward a sidewall. A direction of magnetic anisotropy in the sidewalls of the first magnetic layer, the tunnel barrier layer and the second magnetic layer may be parallel to an interface of the layers due to a high compressive stress of the third sidewall spacer.

These and other aspects, implementations and associated advantages are described in greater detail in the drawings, the description and the claims.

BRIEF DESCRIPTION OF THE DRAWINGS

FIG. 6A shows the case where a direction of a magnetic anisotropy in the sidewall of the MTJ structure is perpendicular to an interface of the layers included in the MTJ structure due to tensile stress. FIG. 6B shows the case where a direction of a magnetic anisotropy in the sidewall of the MTJ structure is parallel to an interface of the layers included in the MTJ structure due to compressive stress.

DETAILED DESCRIPTION

Figure 1A:
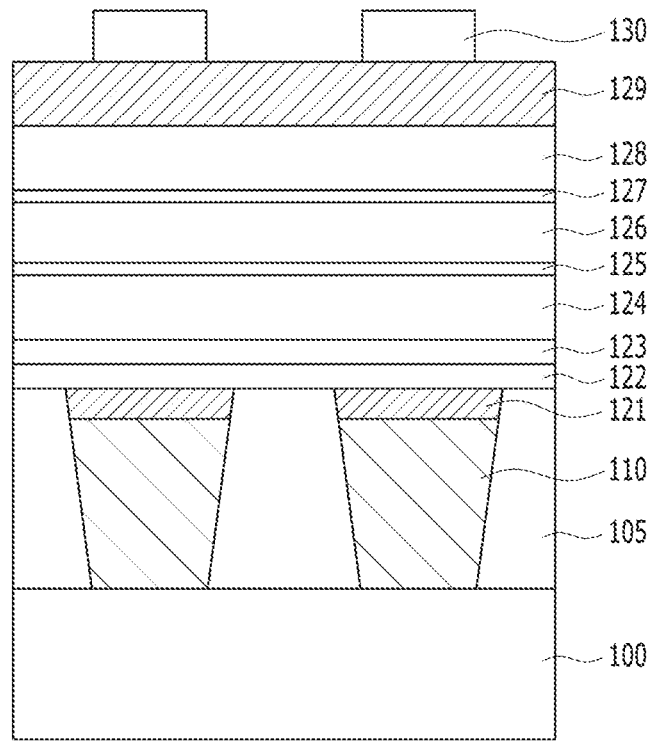
FIGS. 1A to 1E are cross-sectional views illustrating a semiconductor memory and a method for fabricating the same in accordance with a comparative example.

Various examples and implementations of the disclosed technology are described below in detail with reference to the accompanying drawings.

The drawings may not be necessarily to scale and in some instances, proportions of at least some of substrates in the drawings may have been exaggerated in order to clearly illustrate certain features of the described examples or implementations. In presenting a specific example in a drawing or description having two or more layers in a multi-layer substrate, the relative positioning relationship of such layers or the sequence of arranging the layers as shown reflects a particular implementation for the described or illustrated example and a different relative positioning relationship or sequence of arranging the layers may be possible.

Prior to explaining implementations of the present disclosure, a semiconductor memory in accordance with a comparative example will be explained.

FIGS. 1A to 1E are cross-sectional views illustrating a semiconductor memory and a method for fabricating the same in accordance with a comparative example.

Referring to FIG. 1A, an interlayer dielectric layer 105 may be formed over a substrate 100.

Then, the interlayer dielectric layer 105 may be selectively etched to form a hole exposing a portion of the substrate 100. Subsequently, a lower contact plug 110 filling a lower portion of the hole may be formed.

Then, a lower electrode layer 121 disposed over the lower contact plug 110 and filling a remaining portion of the hole may be formed. The lower electrode layer 121 is a part of a variable resistance element so that it may be distinguished from the lower contact plug 110 which is coupled to a lower end of the variable resistance element in order to connect the variable resistance element to another element. The lower electrode layer 121 is buried in the hole, which makes the number of layers to be etched during an etch process for forming the variable resistance element, thereby facilitating the etch process. The lower electrode layer 121 may be formed by forming a conductive material having a thickness enough to fill the hole and performing a planarization process such as CMP (Chemical Mechanical Polishing) process until an upper surface of the interlayer dielectric layer 105 is exposed. As a result, the lower electrode layer 121 may have a planarized upper surface. The lower electrode layer 121 and the lower contact plug 110 may have sidewalls aligned with each other.

Then, material layers 122 to 129 for forming a remaining part of the variable resistance element other than the lower electrode layer 121 may be formed over the interlayer dielectric layer 105 and the lower electrode layer 121. The material layers 122 to 129 may include a buffer layer 122, a seed layer 123, a free layer 124, a tunnel barrier layer 125, a pinned layer 126, an exchange coupling layer 127, a magnetic correction layer 128 and a capping layer 129 which are sequentially stacked. The free layer 124, the pinned layer 126 and the tunnel barrier layer 125 collectively form part of a Magnetic Tunnel Junction (MTJ) structure in which the free layer 124 is structured to exhibit a variable magnetization direction that can be changed to produce different magnetization states for the MTJ structure, the pinned layer 126 is structured to exhibit a fixed magnetization direction (which may also be referred to as a reference layer) and the tunnel barrier layer 125 is interposed between the free layer 124 and the pinned layer 126 to allow the tunneling of electrons in both data reading and data writing operations. The resistance in the electrical path across the MTJ structure exhibits a variable resistance with different resistance values depending on the relative direction between the magnetization directions of the free layer 124 and the pinned layer 126 on two sides of the tunnel barrier layer 125. Accordingly, the magnetization direction of the free layer 124 can be controlled to set the MTJ structure to exhibit different resistance values for storing different digital data. The change in the magnetization direction of the free layer 124 may be induced by spin transfer torque via a spin-polarized current that is directed to flow through the tunnel barrier layer 125 via the electron tunneling. In a read operation, a small read current is directed through the MTJ structure that does not change the magnetization direction of the free layer 124 to enable readout the resistance value of the MTJ structure at a given magnetization direction of the free layer 124. In a write operation, a sufficiently large spin-polarized write current is directed through the MTJ structure to produce a sufficiently high spin transfer torque to change the existing magnetization direction of the free layer 124, thus writing a new magnetization state in the MTJ structure.

In some implementations such as the example shown, the seed layer 123 may be disposed under the free layer 124 and help the free layer 124 to grow with a desired crystal structure and/or lattice structure. The buffer layer 122 may be interposed between the lower electrode layer 121 and the seed layer 123 so that the lower electrode layer 121 does not affect crystallinity of the seed layer 123. The magnetic correction layer 128 may be disposed over the pinned layer 126 and serve to offset or reduce an influence of a stray field produced by the pinned layer 126. The magnetic correction layer 128 may have a magnetization direction anti-parallel to the magnetization direction of the pinned layer 126. The exchange coupling layer 127 may be interposed between the pinned layer 126 and the magnetic correction layer 128 and provide an exchange coupling therebetween. The capping layer 129 may be disposed at the uppermost portion of the variable resistance element and function as both an upper electrode of the variable resistance element and a hard mask for patterning the variable resistance element as described below.

A mask pattern 130 for patterning the variable resistance element may be formed over the capping layer 129. The mask pattern 130 may overlap with the lower electrode layer 121 and have a smaller width than that of the lower electrode layer 121. The width of the mask pattern 130 may be adjusted so that although a width of the stacked structure (see, 122A to 129A of FIG. 1B) is increased downwardly, a width of a lower surface of the stacked structure 122A to 129A is smaller than a width of an upper surface of the lower electrode layer 121. This feature can ensure that the layers included in the variable resistance element are to be formed over a planarized surface in order to secure desired characteristics of the variable resistance element. For example, if a tunnel barrier layer pattern (see, the reference numeral 125A of FIG. 1B) is positioned at the boundary between the lower electrode layer 121 and the interlayer dielectric layer 105, which makes the tunnel barrier layer pattern easily bent, characteristics of the variable resistance element may be deteriorated due to Neel coupling effect. Accordingly, in order to avoid this problem, the lower surface of the stacked structure 122A to 129A overlaps with the upper surface of the lower electrode layer 121 and has a narrower width than that of the upper surface of the lower electrode layer 121. With this structure, the whole lower surface of the stacked structure 122A to 129A comes in contact with the planarized upper surface of the lower electrode layer 121.

Figure 1B:
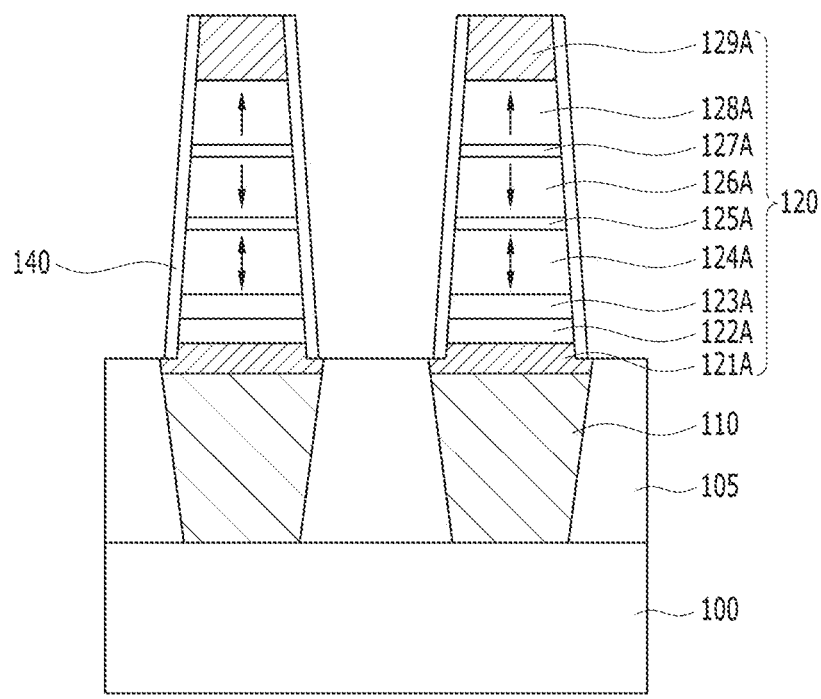

Referring to FIG. 1B, the capping layer 129, the magnetic correction layer 128, the exchange coupling layer 127, the pinned layer 126, the tunnel barrier layer 125, the free layer 124, the seed layer 123 and the buffer layer 122 may be etched using the mask pattern 130 as an etch barrier to form the stacked structure 122A to 129A including a buffer layer pattern 122A, a seed layer pattern 123A, a free layer pattern 124A, a tunnel barrier layer pattern 125A, a pinned layer pattern 126A, an exchange coupling layer pattern 127A, a magnetic correction layer pattern 128A and a capping layer pattern 129A. When a width of the lower surface of the stacked structure 122A to 129A is smaller than that of the upper surface of the lower electrode layer 121, a portion of the lower electrode layer 121 may be exposed by forming the stacked structure 122A to 129A.

In this case, an over etch process may be performed to separate the adjacent stacked structures 122A to 129A from one another and thus, exposed portions of the lower electrode layer 121 and the interlayer dielectric layer 105 may be partially etched. The partially etched lower electrode layer 121 may be referred to as a lower electrode 121A. As such, a variable resistance element 120 is formed so that the lower electrode 121A, the buffer layer pattern 122A, the seed layer pattern 123A, the free layer pattern 124A, the tunnel barrier layer pattern 125A, the pinned layer pattern 126A, the exchange coupling layer pattern 127A, the magnetic correction layer pattern 128A and the capping layer pattern 129A are stacked over one another. A lower portion of the lower electrode 121A may be buried in the interlayer dielectric layer 105 and an upper portion of the lower electrode 121A may protrude from the interlayer dielectric layer 105. The mask pattern 130 may be removed during this etch process or by a separate removal process.

During the etch process for forming the variable resistance element 120, etch byproducts may be formed. The etch byproducts are formed from the layers being etched since some portions of the layers being etched are deposited on a surface instead of being etched. After patterning the variable resistance element 120, the etch byproducts may form an initial spacer 140 on sidewalls of the variable resistance element 120. The etching is performed in a downward direction and thus, among the layers of the variable resistance element 120, the layers located above are etched earlier than the layers located below. Most of the initial spacer 140 is formed with the byproducts from the layers etched at a later timing, i.e., the layers located below, and a small portion of the initial spacer 140 is formed with the byproducts from the layers etched at an earlier timing, i.e., the layers located above. This is because the byproducts from the layers etched relatively earlier in the fabrication process are removed again during the subsequent etch process, as the etch process proceeds. The byproducts from the layers etched relatively later in the fabrication are exposed to the etching process for a less time than the byproducts from the layers etched earlier.

The initial spacer 140 formed on the sidewalls of the variable resistance element 120 may mainly include materials included in the buffer layer pattern 122A and the lower electrode 121A. Although the lower electrode 121A is located under the buffer layer pattern 122A and may be etched at last, the initial spacer 140 includes materials of the buffer layer pattern 122A as well as the materials of the lower electrode 121A. The reason is that the lower electrode layer 121 is etched by an over etch process and thus, the etch byproducts derived from the buffer layer 122 may not be sufficiently removed during the etch process on the lower electrode layer 121. The buffer layer pattern 122A and the lower electrode 121A may include a metal-containing material such as a metal, a metal nitride, or others. Therefore, the initial spacer 140 includes the metal and the metal may cause a problem of leakage current through the initial spacer 140. For example, although the free layer pattern 124A and the pinned layer pattern 126A should be electrically insulated, they may be electrically coupled to each other through the initial spacer 140.

Figure 1C:
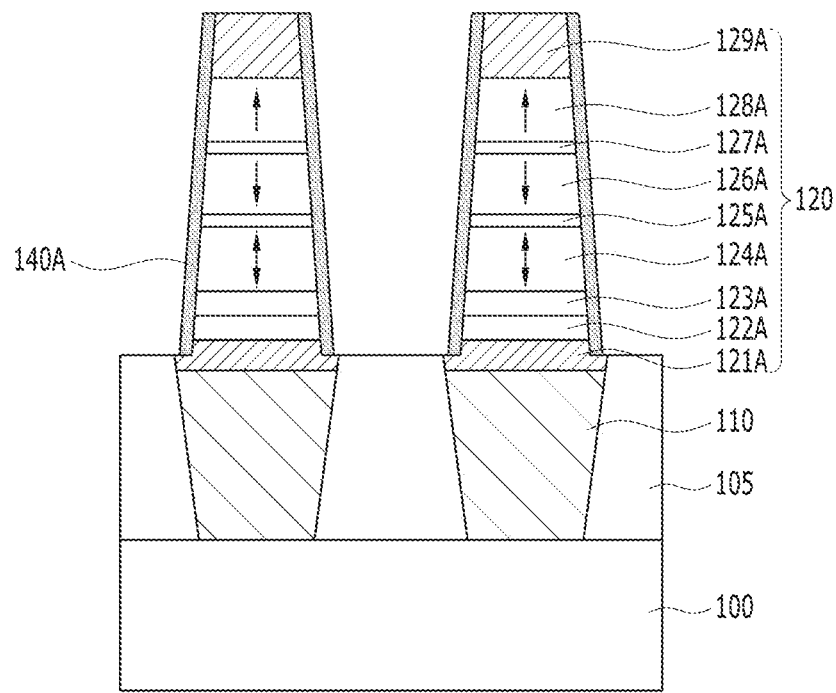

Referring to FIG. 1C, in order to resolve such a problem, the initial spacer 140 may be converted into a first spacer 140A including an insulating metal oxide by performing an oxidation process. Through the oxidation process, the initial spacer 140 may be changed to include an insulating metal oxide.

Figure 1D:
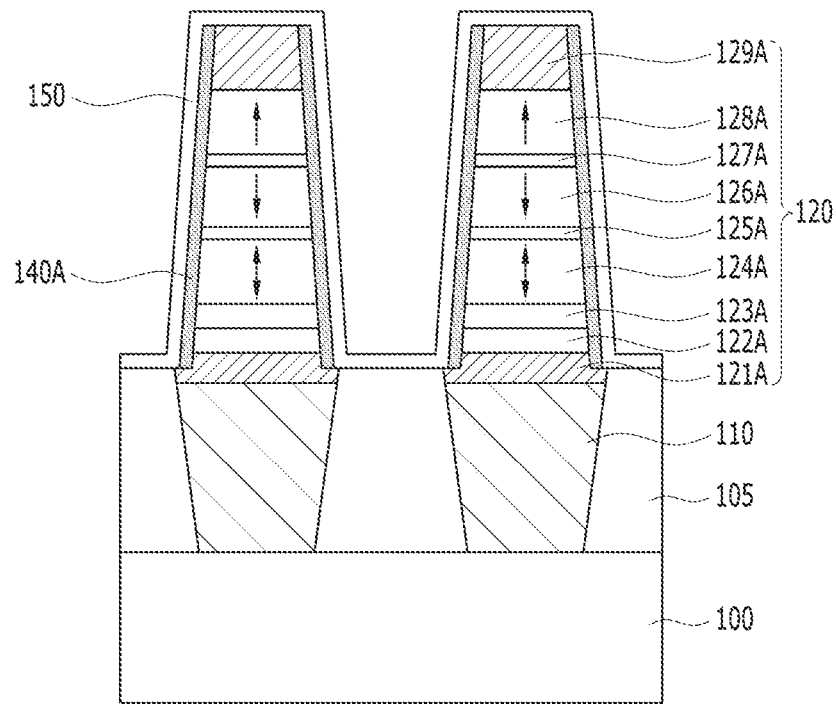

Referring to FIG. 1D, a second spacer 150 may be formed along a resultant structure in which the first spacer 140A is included through the oxidation process. The second spacer 150 may serve to protect the variable resistance element 120. In some implementations, the second spacer 150 protects the variable resistance element 120 together with the first spacer 140. In some cases, the second spacer 150 may be omitted. The second spacer 150 may include various insulating materials such as a silicon oxide, or a silicon nitride, or a combination thereof.

Figure 1E:
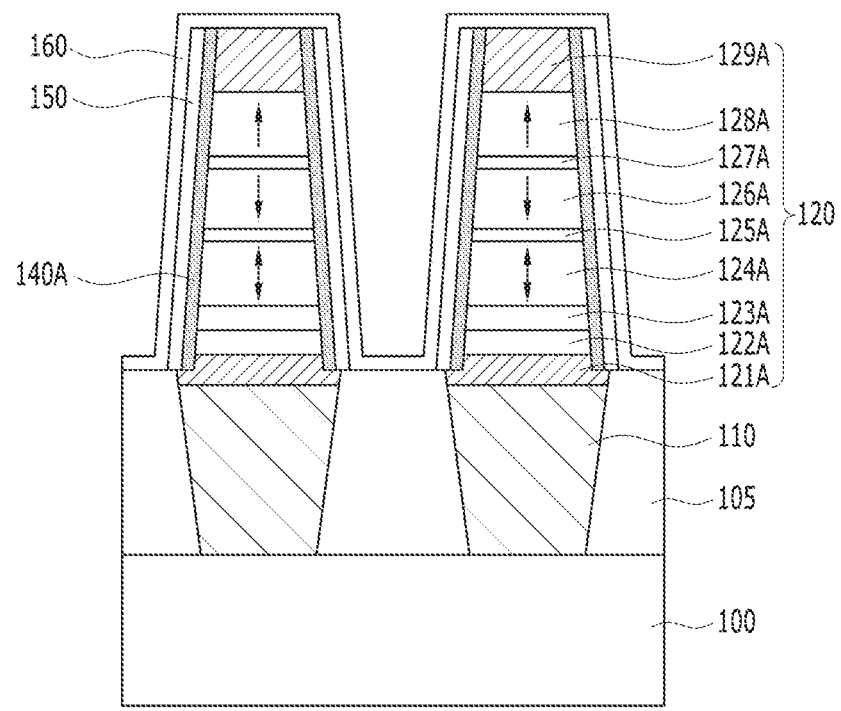

Referring to FIG. 1E, the first spacer 140A and the second spacer 150 may be positioned on sidewalls of the variable resistance element 120 by performing a blanket etch process on the second spacer 150 and/or the first s pacer 140A.

Then, a protective layer 160 for protecting the variable resistance element 120 may be formed along a resultant structure in which the blanket etch process has been performed. The protective layer 160 may include an insulating material such as a silicon nitride. In some cases, the protective layer 160 may be omitted.

Subsequently, although it is not shown, it is possible to perform a process for forming an interlayer dielectric layer covering a resultant structure of FIG. 1E and forming an upper contact plug passing through the interlayer dielectric layer and coupled to an upper end of the variable resistance element 120.

Referring back to FIG. 1C, in the comparative example, the initial spacer 140 may be changed into an insulating material by an oxidation process. However, in this case of oxidation, not only the initial spacer 140 but also a portion of layers included in the variable resistance element 120 may be oxidized and thus, characteristics of the variable resistance element 120 may be deteriorated. For example, when both sidewalls of the magnetic correction layer pattern 128A are oxidized, a width of the magnetic correction layer pattern 128A is actually reduced and the magnetic correction layer pattern 128A having the reduced width cannot appropriately perform a magnetic correction function. As a result, operation characteristics of the variable resistance element 120 may be deteriorated. To avoid this problem, if the oxidation process is omitted or performed with less strength, the initial spacer 140 may not be properly oxidized to cause leakage current.

In accordance with an implementation of the present disclosure, a semiconductor memory and its fabricating method are provided to achieve desired characteristics of the variable resistance element and simultaneously overcome the above-mentioned problems on the oxidation, for example, a trade-off between the current leakage and the deterioration of the operation characteristics.

FIGS. 2A to 2G are cross-sectional views illustrating an exemplary semiconductor memory and a method for fabricating the same in accordance with an implementation of the present disclosure.

Figure 2A:
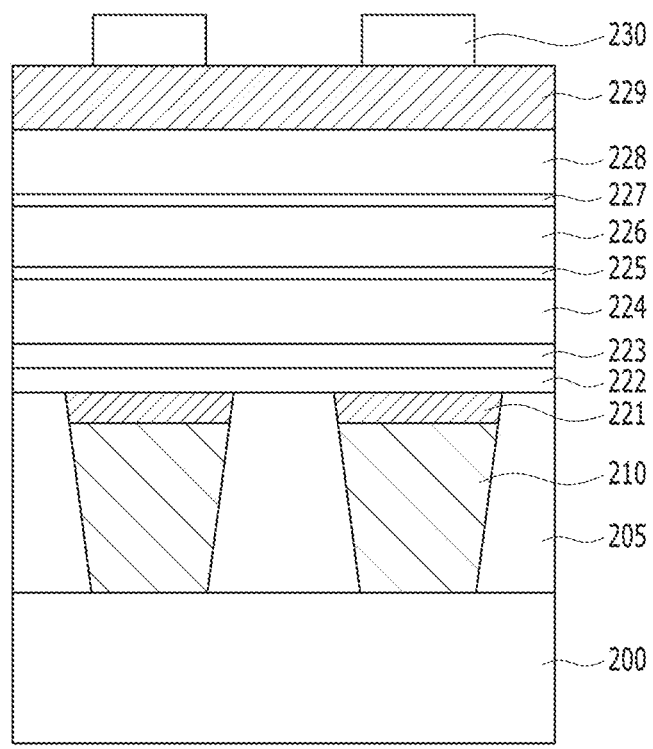
FIGS. 2A to 2G are cross-sectional views illustrating an exemplary semiconductor memory and a method for fabricating the same in accordance with an implementation of the present disclosure.

Referring to FIG. 2A, a substrate 200 where predetermined required structures such as a switching device (not shown) are formed may be provided. Here, the switching device is coupled to a variable resistance element and controls the supply of a current or voltage to the variable resistance element. For example, the switching device may include a transistor or a diode. The switching device may have one end to be electrically connected to a lower contact plug 210, which is to be described below, and the other end to be electrically connected to a line that is not illustrated in the drawing, such as a source line.

Subsequently, a first interlayer dielectric layer 205 may be formed over the substrate 200. The first interlayer dielectric layer 205 may include various insulating materials such as a silicon oxide, or a silicon nitride or a combination thereof.

Subsequently, a lower contact plug 210 may be formed to pass through the first interlayer dielectric layer 205 and be coupled to a portion of the substrate 200. The lower contact plug 210 may be formed by selectively etching the first interlayer dielectric layer 205 to form a hole exposing a portion of the substrate 200, depositing a conductive material in a thickness that fills a portion of the hole and performing a planarization process such as a CMP process until the conductive material has a desired thickness. The lower contact plug 210 may include a conductive material having an excellent filling property and high electrical conductivity, for example, a metal such as tungsten (W), tantalum (Ta), or any other metal, or metal nitride such as titanium nitride (TiN), or others.

Subsequently, a lower electrode layer 221 of a variable resistance element 220 disposed over the lower contact plug 210 and filling a remaining portion of the hole may be formed. The lower electrode layer 221 is a part of the variable resistance element so that it may be distinguished from the lower contact plug 210 that is coupled to a lower end of the variable resistance element in order to connect the variable resistance element to another device. The lower electrode layer 221 may be formed by depositing a conductive material in a thickness that sufficiently fills the hole in which the lower contact plug 210 is formed and performing a planarization process such as a CMP process until an upper surface of the first interlayer dielectric layer 205 is exposed. As a result, the lower electrode layer 221 may have a planarized upper surface. The lower electrode layer 221 may be buried in the contact hole so as to reduce the number of layers to be etched during performing an etch process for forming variable resistance element, thereby facilitating the etch process.

The lower electrode layer 221 may include a metal-containing material. For example, lower electrode layer 221 has a single-layer structure or a multi-layer structure that includes a metal such as Hf, Fe, Al, Mg, Zr, Nb, Mo, Ta, W or Ti, an oxide of the metal, or a nitride of the metal.

The lower electrode layer 221 and the lower contact plug 210 may have sidewalls aligned with each other.

Subsequently, material layers 222 to 229 for forming a remaining part of the variable resistance element may be formed over the first interlayer dielectric layer 205 and the lower electrode layer 221. As shown in FIG. 2A, the variable resistance element includes the lower electrode layer 221 formed in the first interlayer dielectric layer 205 and the material layers 222 to 229 formed over the first interlayer dielectric layer 305. In this implementation, the material layers 222 to 229 may include a buffer layer 222, a seed layer 223, a free layer 224, a tunnel barrier layer 225, a pinned layer 226, an exchange coupling layer 227, a magnetic correction layer 228 and a capping layer 229 which are sequentially stacked.

The free layer 224, the pinned layer 226, and the tunnel barrier layer 225 collectively form part of a magnetic tunnel junction (MTJ) structure exhibiting variable resistance values for storing different data bits as explained above. The free layer 224 has a variable magnetization direction, the pinned layer 226 has a fixed magnetization direction, and the tunnel barrier layer 225 is interposed between the free layer 224 and the pinned layer 226 to allow the tunneling of electrons in both data reading and data writing operations.

The free layer 224 may have a variable magnetization direction that changes between different directions to cause the MTJ structure to have a variable resistance value. With the change of the magnetization direction of the free layer 224, the relative relationship of the magnetization directions of the free layer 224 and the pinned layer 226 also changes, which allows the variable resistance element 220 to store different data or represent different data bits. The free layer 224 may also be referred as a storage layer or the like. The magnetization direction of the free layer 224 may be substantially perpendicular to a surface of the free layer 224, the tunnel barrier layer 225 and the pinned layer 226. In other words, the magnetization direction of the free layer 224 may be substantially parallel to stacking directions of the free layer 224, the tunnel barrier layer 225 and the pinned layer 226. Therefore, the magnetization direction of the free layer 224 may be changed between a downward direction and an upward direction. The change in the magnetization direction of the free layer 224 may be induced by spin transfer torque.

The free layer 224 may have a single-layer or multilayer structure including a ferromagnetic material. For example, the free layer 224 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or others, or may include a stack of metals, such as Co/Pt, or Co/Pd, or others.

The tunnel barrier layer 225 may allow the tunneling of electrons in both data reading and data writing operations. In a write operation for storing new data, a high write current may be directed through the tunnel barrier layer 225 to change the magnetization direction of the free layer 224 and thus to change the resistance state of the MTJ for writing a new data bit. In a reading operation, a low reading current may be directed through the tunnel barrier layer 225 without changing the magnetization direction of the free layer 224 to measure the existing resistance state of the MTJ under the existing magnetization direction of the free layer 224 to read the stored data bit in the MTJ. The tunnel barrier layer 225 may include a dielectric oxide, for example, an oxide such as MgO, CaO, SrO, TiO, VO, or NbO or others.

The pinned layer 226 may have a pinned magnetization direction which contrasts with the magnetization direction of the free layer 224, and may be referred to as a reference layer or the like. In some implementations, the magnetization direction of the pinned layer 226 may be pinned in a downward direction. In some implementations, the magnetization direction of the pinned layer 226 may be pinned in an upward direction.

The pinned layer 226 may have a single-layer or multi-layer structure including a ferromagnetic material. For example, the pinned layer 226 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy or the like, or may include a stack of metals, such as Co/Pt, or Co/Pd or the like.

In some implementations, the positions of the free layer 224 and the pinned layer 226 with respect to the tunnel barrier layer 225 may be changed with each other. For example, the free layer 224 may be disposed on the tunnel barrier layer 225 and the pinned layer 226 may be disposed under the tunnel barrier layer 225 and over the seed layer 223.

The seed layer 223 may help a magnetic layer disposed on the seed layer 223 to grow with a desired crystalline structure and/or lattice structure. For example, the seed layer 223 may have a crystalline structure so as to improve perpendicular magnetic crystalline anisotropy of the magnetic layer disposed on the seed layer 223. In one implementation, the seed layer 223 may be disposed under the free layer 224 and help a growth of the free layer 224. The layer which is disposed over the seed layer 223, however, is not limited to the free layer 224 and other implementations are possible. For example, in another implementation where the pinned layer 226 is disposed on the seed layer 223, the seed layer 223 may help a growth of the pinned layer 226. The seed layer 223 may include a metal-containing material. For example, the seed layer 223 may have a single-layer structure or a multi-layer structure including a metal such as Hf, Mg, Zr, Nb, Mo, Ta, W, or Ti, or an oxide of the metal or nitride of the metal.

The buffer layer 222 may be interposed between the lower electrode layer 221 and the seed layer 223 to reduce the influence on the seed layer 223 by the lower electrode layer 221. For example, the buffer layer 222 operates so that the lower electrode layer 221 does not exert an influence on the crystallinity of the seed layer 223. The buffer layer 222 may include a metal-containing material. For example, the buffer layer 222 may have a single-layer structure or a multi-layer structure including a metal such as Hf, Mg, Zr, Nb, Mo, Ta, W, or Ti, or others, or an oxide of the metal or a nitride of the metal.

The magnetic correction layer 228 may be disposed on the pinned layer 226 and offset or reduce an influence of a stray field generated by the pinned layer 226 so as to reduce a bias magnetic field in the free layer 224 due to the stray field of the pinned layer 226. For this purpose, the magnetic correction layer 228 may have a magnetization direction opposite to that of the pinned layer 226 and have a single-layer structure or a multi-layer structure including a ferromagnetic material.

The exchange coupling layer 227 may be interposed between the pinned layer 226 and the magnetic correction layer 228 to provide an exchange coupling therebetween. For example, the exchange coupling layer 227 may provide an exchange coupling between the pinned layer 226 and the magnetic correction layer 228 so as to have magnetization directions of the pinned layer 226 and the magnetic correction layer 228 to be anti-parallel to each other. The exchange coupling layer 227 may include a noble metal such as Ru, or others.

The capping layer 229 may be disposed in an uppermost portion of the variable resistance element 220 to function as both an upper electrode of the variable resistance element 220 and a hard mask for patterning the variable resistance element 220 as described below. The capping layer 229 may have a single-layer structure or a multi-layer structure including various conductive materials such as a metal, or metal nitride.

A mask pattern 230 for patterning the variable resistance element 220 may be formed over the capping layer 229. The mask pattern 230 may overlap with the lower electrode layer 221 and have a smaller width than a width of the lower electrode layer 221. In some implementations, a width of the mask pattern 230 may be adjusted so that a width of a lower surface of a stacked structure (see the reference numerals 222A to 229A of FIG. 2B) is smaller than a width of an upper surface of the lower electrode layer 221 and thus, the whole stacked structure 222A to 229A is disposed over the lower electrode layer 221. This ensures the layers of the variable resistance element 220 are placed over the lower electrode layer 221. Accordingly, the layers of the variable resistance element 220 are disposed over the planarized surface, which allows to secure characteristics of the variable resistance element 220. The mask pattern 230 may include various conductive materials such as a metal, or a metal nitride, or others.

Figure 2B:
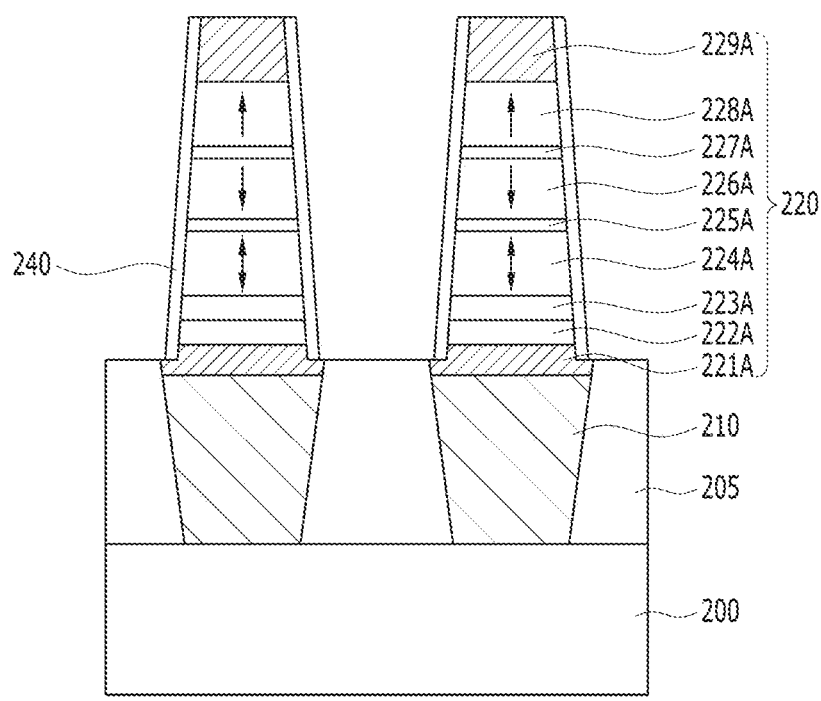

Referring to FIG. 2B, the capping layer 229, the magnetic correction layer 228, the exchange coupling layer 227, the pinned layer 226, the tunnel barrier layer 225, the free layer 224, the seed layer 223 and the buffer layer 222 may be etched using the mask pattern 230 as an etch barrier to form the stacked structure 222A to 229A in which a buffer layer pattern 222A, a seed layer pattern 223A, a free layer pattern 224A, a tunnel barrier layer pattern 225A, a pinned layer pattern 226A, an exchange coupling layer pattern 227A, a magnetic correction layer pattern 228A and a capping layer pattern 229A are sequentially stacked. This etch process may be performed by a method having a strong physical etching characteristic such as an Ion Beam Etching (IBE) or a Reactive Ion Etching (RIE). As such, the stacked structure including the layers 222A to 229A may have a width increasing downwardly. Here, a width of a lower surface of the stacked structure 222A to 229A may be smaller than a width of an upper surface of the lower electrode layer 221 and thus, a portion of the upper surface of the lower electrode layer 221 may be exposed by the stacked structure 222A to 229A.

During this etch process, an over etch process may be performed to separate the adjacent stacked structures 222A to 229A. As a result, a portion of the lower electrode layer 221 and a portion of the first interlayer dielectric layer 205 may be etched as well. The portion of the first interlayer dielectric layer 205, which is etched by the over etch process, is the area exposed by forming the stacked structure 222A to 229A, may be etched. After a portion of the lower electrode layer 221 is etched, the remaining lower electrode layer may be referred to as a lower electrode 221A. As such, the variable resistance element 220 in which the lower electrode 221A, the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A are stacked may be formed. A lower portion of the lower electrode 221A may be buried in the first interlayer dielectric layer 205 and an upper portion of the lower electrode 221A may protrude from the first interlayer dielectric layer 205. In some implementations, the upper portion of the bottom electrode 221A may have sidewalls which are aligned with the stacked structure 222A to 229A, while the lower portion of the bottom electrode 221A may have sidewalls which are not aligned with the stacked structure 222A to 229A. In some implementations, as shown in FIG. 2B, the width of the lower portion of the bottom electrode 221A is greater than the upper portion of the bottom electrode 221A and thus, the sidewalls of the lower portion of the bottom electrode 221A are located outwardly of the sidewalls of the stack structure 221A to 229A. During this etch process or by a separate removal process, the mask pattern 230 may be removed. Alternatively, although it is not shown, when the mask pattern 230 includes a conductive material, a portion of the mask pattern 230 may remain.

During this etch process, etch byproducts may be redeposited on sidewalls of the variable resistance element 220 to form an initial sidewall spacer 240 on the exposed external surface of each sidewall. The initial sidewall spacer 240 may include materials most of which are from the buffer layer pattern 221A and the lower electrode 221A. Thus, most materials of the initial sidewall spacer 240 are materials contained in the buffer layer pattern 222A and the lower electrode 221A. This is because the buffer layer pattern 222A and the lower electrode 221A are disposed in a lower portion of the variable resistance element 220. As discussed above with regard to FIG. 1B, the initial sidewall spacer 240 include materials mostly from the layers etched relatively later since the layers etched relatively earlier are subject to the etching process for a longer period and thus, even if byproducts are formed from those layers, the byproducts are removed again during the subsequent etch process. In some implementations, however, the process can be adjusted so that the initial sidewall spacer 240 may further include a metal contained in the remaining parts 223A to 229A of the variable resistance element 220. The buffer layer pattern 221A and the lower electrode 221A include the metal of which oxide may have an insulating characteristic. For example, the metal may include Hf, Fe, Al, Mg, Zr, Nb, Mo, Ta, W, or Ti, or a combination thereof.

Figure 2C:
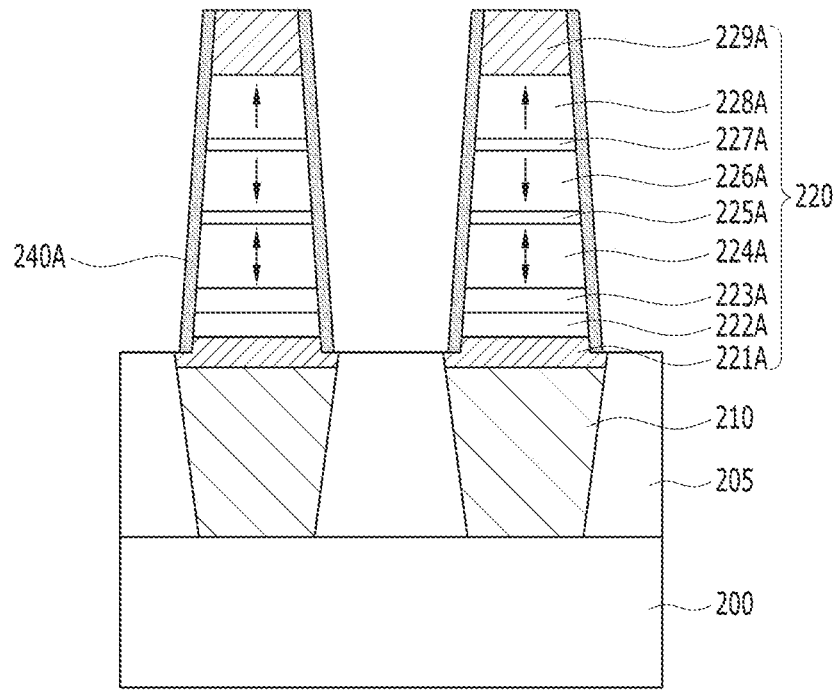

Referring to FIG. 2C, an oxidation process may be performed to convert the initial sidewall spacer 240 into a first sidewall spacer 240A including an insulating metal oxide. For example, by performing the oxidation process, the initial sidewall spacer 240 including a metal-containing material such as a metal, a metal nitride, or others derived from the buffer layer pattern 222A and the lower electrode 221A may be converted into the first sidewall spacer 240A including an insulating metal oxide. Since the first sidewall spacer 240A has the insulating property, it is possible to overcome a problem of leakage current which was caused by the initial sidewall spacer 240.

Figure 2D:
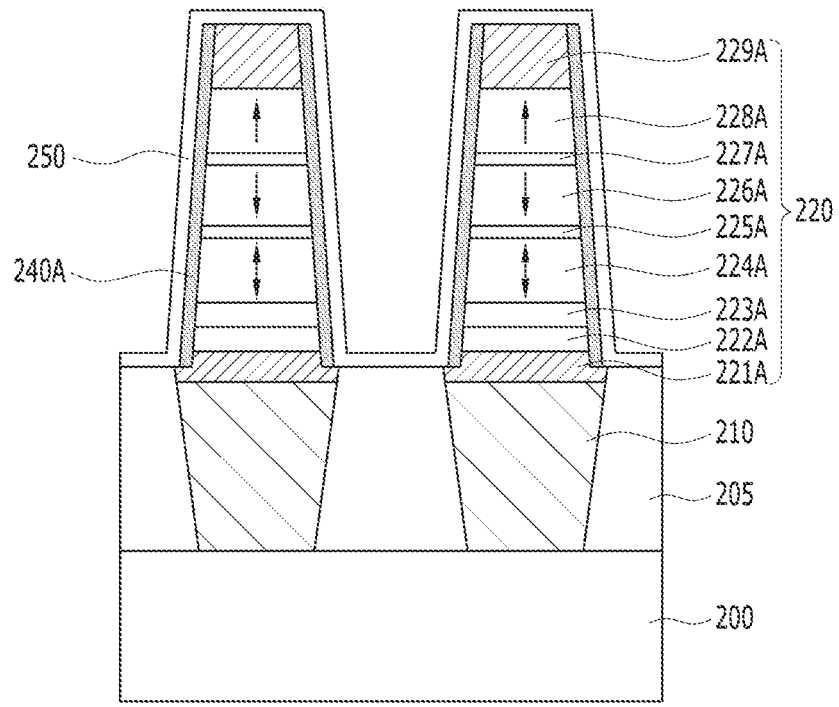

Additional sidewall spaces may be formed in subsequent fabrication. Referring to FIG. 2D, a second sidewall spacer 250 may be formed along a resultant structure in which the oxidation process has been performed. The second sidewall spacer 250 may serve to further protect the variable resistance element 220. In some cases, the second sidewall spacer 250 may be omitted. The second sidewall spacer 250 may include various insulating materials such as a silicon oxide, or a silicon nitride or a combination thereof. In some implementations, the second sidewall spacer 250 includes a porous film having a thin thickness.

Figure 2E:
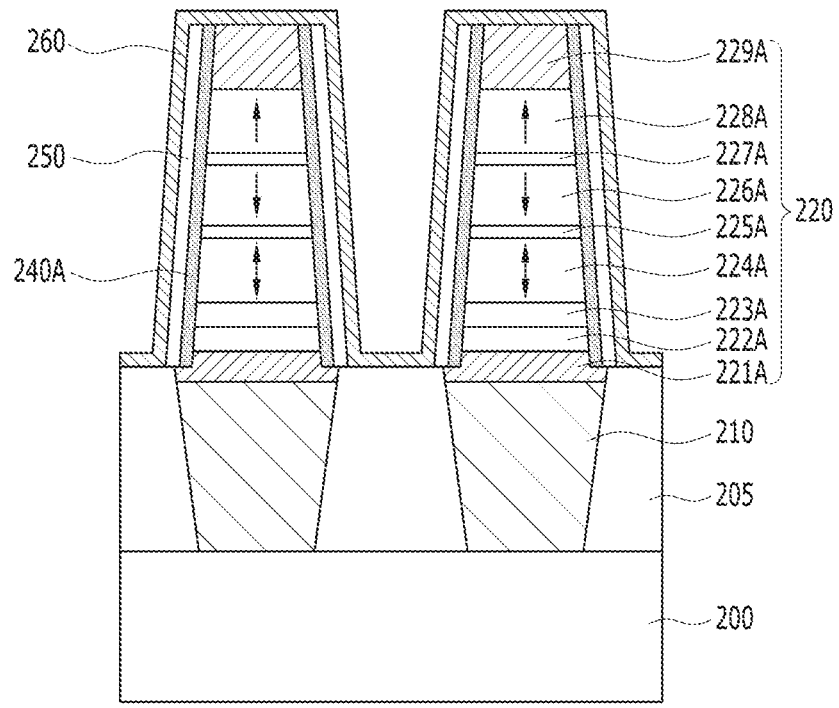

Referring to FIG. 2E, a third sidewall spacer 260 may be disposed on over the existing first sidewall spacer 240A and the second sidewall spacer 250 on the sidewalls of the variable resistance element 220 by performing a suitable etch process, for example, a blanket etch process, on.

This third spacer 260 may include a low temperature amorphous silicon, which is deposited at a low temperature, for example, a temperature of about 400° C. or less. In general, there are not many materials that can be deposited at a low temperature, and even if deposited at a low temperature, the film quality may be poor. For example, in the process for forming a spacer, when a nitride or an oxide is deposited at a low temperature, the film has porosity to have a poor film quality and low stress of about several MPa. Therefore, it is difficult to obtain a high compressive film at a low temperature. However, by including amorphous silicon for the third sidewall spacer 260, it is possible to obtain the third spacer 260 that is more stable. The third sidewall spacer 260 including amorphous silicon that is deposited at a low temperature also can achieve compressive stress as high as several GPa. In the present implementation, the third sidewall spacer 260 is formed of or includes low-temperature amorphous silicon, so that compressive stress in the sidewalls of the variable resistance element 220 can be strengthened and a direction of magnetic anisotropy of the sidewalls can be changed from a vertical direction to a horizontal direction with respect to a surface of the layers of the variable resistance element 220. By changing the direction of magnetic anisotropy of the sidewalls of the variable resistance element 220, it is possible to reduce or resolve deterioration of perpendicular magnetic anisotropy in an edge portions of the variable resistance element 220 and enhance a compressive stress to improve WER0. The effects that can be achieved by forming the third sidewall spacer 260 of low-temperature amorphous silicon will be further explained with reference to FIGS. 6A and 6B.

The third sidewall spacer 260 may be formed by depositing an amorphous silicon through a low-temperature process. In general, the low-temperature process may be referred to as a process which is performed at a temperature of about 400° C. or less. Therefore, the deposition temperature may be about 400° C. or less, for example, from about 150° C. to about 400° C., from about 150° C. to about 250° C., from about 200° C. to about 250° C., from about 150° C. to about 200° C., or from about 175° C. to about 225° C.

As described above, the third sidewall spacer 260 may exhibit a high compressive stress, for example, from 0.5 to 1.5 GPa. When the third sidewall spacer 260 exhibit a compressive stress ranging from 0.5 to 1.5 GPa, a high compressive stress that compress the structure can be applied to the sidewalls of the variable resistance element 220 and thus, a direction of magnetic anisotropy in the sidewalls can be a horizontal direction with respect to a surface of the layers of the variable resistance element 220. Therefore, it is possible to reduce or resolve deterioration of perpendicular magnetic anisotropy in an edge portions of the variable resistance element 220 and improve WER0. In case that the third sidewall spacer 260 exhibits a compressive stress less than 0.5 GPa, the compressive stress applied to the sidewalls of the variable resistance element 220 may not be sufficiently high to change a direction of magnetic anisotropy to a horizontal direction so that the desirable effect as described above may not be achieved. In case that the third sidewall spacer 260 exhibits a compressive stress more than 1.5 GPa, physical and electrical properties of the variable resistance element 220 may be lowered due to an excessively high compressive stress.

The low-temperature amorphous silicon may be deposited by any suitable deposition process such as PECVD (plasma enhanced chemical vapor deposition) using $SiCl_4$, $SiH_4$, or $Si_2H_4$ or a combination thereof as a reactive gas.

In another implementation, the third sidewall spacer 260 may include a boron-doped amorphous silicon. When the third sidewall spacer 260 is formed of or includes a boron-doped amorphous silicon, the boron content in the sidewalls of the variable resistance element 220 may be increased due to the boron ions included in the third sidewall spacer 260. Moreover, the boron ions included in the third sidewall spacer 260 may penetrate into the first sidewall spacer 240A. Since the second sidewall spacer 250 may be usually formed of a porous film having a thin thickness, the boron ions included in the third sidewall spacer 260 may penetrate into the first sidewall spacer 240A through the second sidewall spacer 250. Therefore, the boron content in the sidewalls of the variable resistance element 220 can be increased and thus, perpendicular magnetic anisotropy of the variable resistance element 220 can be improved. As a result, it is possible to improve characteristics of the variable resistance element 220.

The boron-doped amorphous silicon may be deposited by a similar process to the deposition of amorphous silicon using $BCl_3$, or $B_2H_6$ or a combination thereof together with $SiCl_4$, $SiH_4$, or $Si_2H_4$ or a combination thereof as a reactive gas.

In further another implementation, the third sidewall spacer 260 may include germanium-inserted amorphous silicon. When the third sidewall spacer 260 is formed of germanium-inserted amorphous silicon, germanium may serve to block boron out-diffusion. Therefore, the third sidewall spacer 260 can prevent boron out-diffusion from the free layer pattern 224A, the pinned layer pattern 226A, the magnetic correction layer pattern 228A, or others to increase the boron content in the sidewalls of the variable resistance element 220. As a result, perpendicular magnetic anisotropy of the variable resistance element 220 can be increased so as to improve characteristics of the variable resistance element 220.

The germanium-inserted amorphous silicon may be deposited by a similar process to the deposition of amorphous silicon using $GeH_4$ or others together with $SiCl_4$, $SiH_4$, or $Si_2H_4$ or a combination thereof by a reactive gas.

Figure 2F:
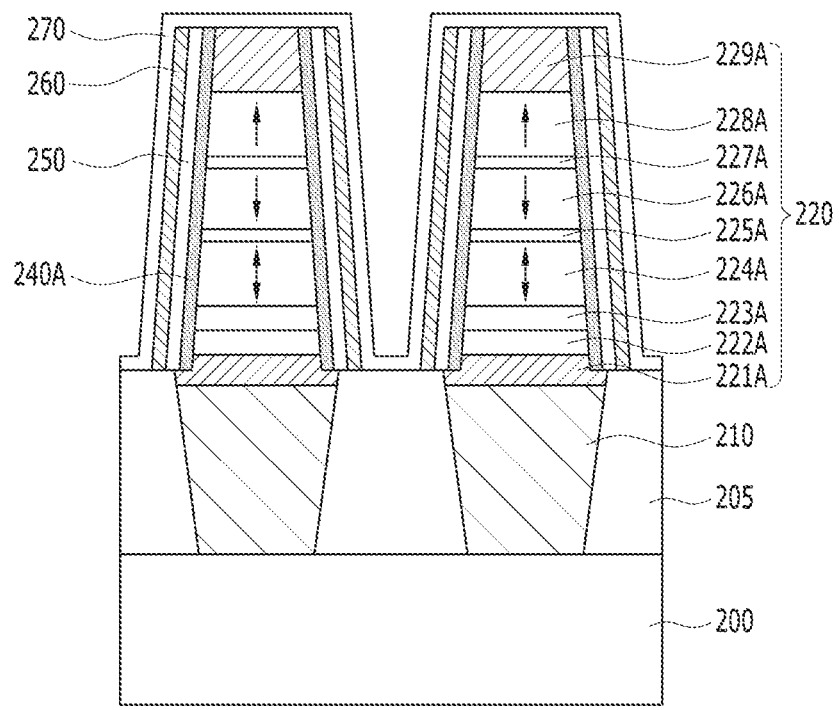

Referring to FIG. 2F, the first sidewall spacer 240A, the second sidewall spacer 250 and the third sidewall spacer 260 may be disposed on the sidewalls of the variable resistance element 220 by performing a blanket etch process on the first sidewall spacer 240A, the second sidewall spacer 250 and the third sidewall spacer 260.

In another implementation, although it is not shown, the first sidewall spacer 240A, the second sidewall spacer 250 and the third sidewall spacer 260 are located on the sidewalls of the variable resistance element 220 by using a technique different from the blanket etch process. For example, the blanket etch process may not be performed on the first sidewall spacer 240A, the second sidewall spacer 250 and the third sidewall spacer 260. In this case, the first sidewall spacer 240A and the second sidewall spacer 250 may be disposed on the sidewalls of the variable resistance element 220 and the third sidewall spacer 260 may be disposed along a resultant structure including the first sidewall spacer 240A and the second sidewall spacer 250.

A protective layer 270 may be formed along a resultant structure including the sidewall spacers 240A, 250 and 260 outside sidewalls of the MTJ. The protective layer 270 may serve to protect the variable resistance element 220 and include an insulating material such as a silicon nitride.

Figure 2G:
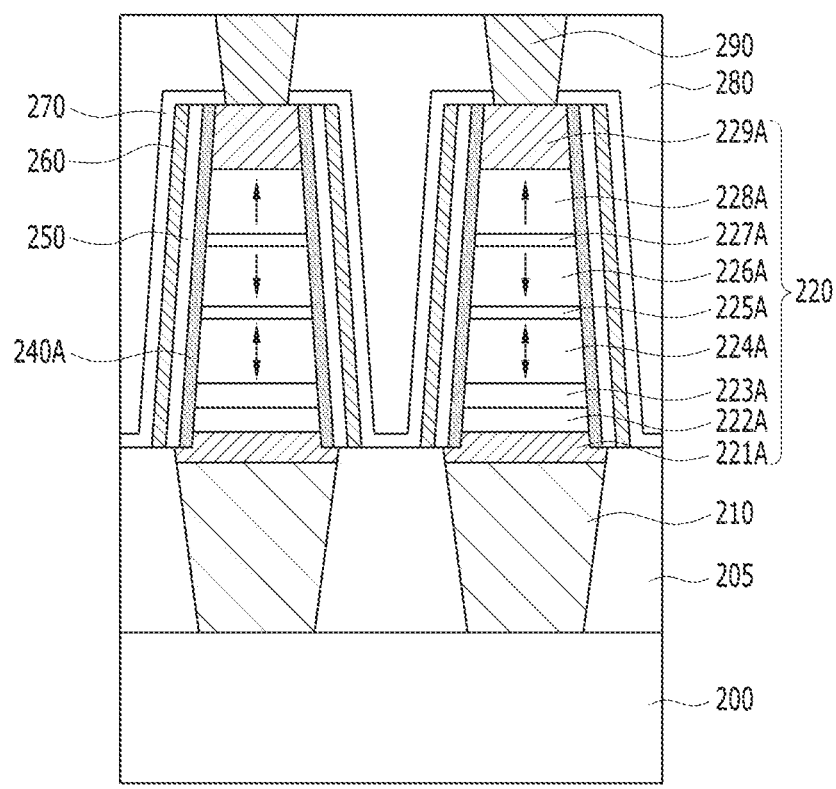

Referring to FIG. 2G, a second interlayer dielectric layer 280 covering the structure of FIG. 2F may be formed. The second interlayer dielectric layer 280 may be formed by depositing an insulating material and performing a planarization process.

Subsequently, an upper contact plug 290 passing through the second interlayer dielectric layer 280 and electrically coupled to the variable resistance element, for example, an upper end of the variable resistance element 220 may be formed. As shown in FIG. 2G, the upper contact plug 290 is electrically coupled to the capping layer pattern 229A. The upper contact plug 290 may be formed by selectively etching the second interlayer dielectric layer 280 to form a contact hole exposing the capping layer pattern 229A, depositing a conductive material in a thickness that sufficiently fills the contact hole and performing a planarization process until the second interlayer dielectric layer 280 is exposed. The upper contact plug 290 may include a conductive material having an excellent filling property and high electrical conductivity, for example, a metal such as tungsten (W), tantalum (Ta), or a metal nitride such as a titanium nitride (TiN).

Although it is not shown, lines that are electrically coupled to the upper contact plug 290, for example, bit lines, may be formed over the second interlayer dielectric layer 280 and the upper contact plug 290.

The semiconductor memory shown in FIG. 2G may be fabricated through the process described above.

Referring back to FIG. 2G, the semiconductor memory in accordance with the implementation of the present disclosure may include the lower contact plug 210 disposed over the substrate 200 and coupled to a portion of the substrate 200, the lower electrode 221A of the variable resistance element 220 disposed over the lower contact plug 210 and coupled to the lower contact plug 210, the remaining part 222A to 229A disposed over the lower electrode 221A and coupled to the lower electrode 221A, the first sidewall spacer 240A, the second sidewall spacer 250 and the third sidewall spacer 260 formed on the sidewalls of the variable resistance element 220, and the protective layer 270 covering the variable resistance element 220.

Here, the lower portion of the lower electrode 221A may be buried in the first interlayer dielectric layer 205 and the upper portion of the lower electrode 221A may protrude from the first interlayer dielectric layer 205. The upper portion of the lower electrode 221A may have the sidewalls that are aligned with the stacked structure 222A to 229A, while the lower portion of the lower electrode 221A may have the sidewalls that are not aligned with the stacked structure 222A to 229A.

The remaining part 222A to 229A of the variable resistance element 220 may include the buffer layer pattern 222A, the seed layer pattern 223A, the free layer pattern 224A, the tunnel barrier layer pattern 225A, the pinned layer pattern 226A, the exchange coupling layer pattern 227A, the magnetic correction layer pattern 228A and the capping layer pattern 229A.

The first spacer 240A may include a metal oxide and have an insulating characteristic. The metal may be the same metal included in the lower electrode 221A and/or the buffer layer pattern 222A. In some implementations, the first spacer 240A may further include a metal contained in a remaining part 223A to 229A of the variable resistance element 220 depending on the process. For example, the metal in the first sidewall spacer 240A may include Hf, Fe, Al, Mg, Zr, Nb, Mo, Ta, W, or Ti, or a combination thereof. The second sidewall spacer 250 may include various insulating materials such as a silicon oxide, or a silicon nitride or a combination thereof. The third sidewall spacer 260 may include a low-temperature amorphous silicon, a boron-doped low-temperature amorphous silicon, or a germanium-inserted low-temperature amorphous silicon, or a combination thereof.

The protective layer 270 may include an insulating material such as a silicon nitride.

The variable resistance element 220 may store data by switching between different resistance states according to a voltage or current applied to the variable element 220. In some implementations, the voltage or current may be applied to the upper end and the lower end of the variable resistance element 220 through the lower contact plug 210 and the upper contact plug 290, respectively. If a voltage or current is applied to the variable resistance element 220, the magnetization direction of the free layer pattern 224A may be changed by spin torque transfer. When the magnetization directions of the free layer pattern 224A and the pinned layer pattern 226A are parallel to each other, the variable resistance element 220 may be in a low resistance state to store a designated digital data bit such as '0'. Conversely, when the magnetization directions of the free layer pattern 224A and the pinned layer pattern 226A are anti-parallel to each other, the variable resistance element 220 may be in a high resistance state to store a designated digital data bit such as '1'. In some implementations, the variable resistance element 220 can be configured to store data bit '1' when the magnetization directions of the free layer pattern 224A and the pinned layer pattern 226A are parallel to each other and to store data bit '0' when the magnetization directions of the free layer pattern 224A and the pinned layer pattern 226A are anti-parallel to each other.

The magnetization directions of the free layer pattern 224A and the pinned layer pattern 226A may be substantially perpendicular to an interface of the layers, for example, an interface between the free layer pattern 224A and the tunnel barrier layer pattern 225A. In some implementation, the variable resistance element 220 may include a perpendicular MTJ structure. The magnetization direction of the magnetic correction layer pattern 228A may be anti-parallel to the magnetization direction of the pinned layer pattern 226A. As such, when the pinned layer pattern 226A has a downward magnetization direction, the magnetic correction layer pattern 228A may have an upward magnetization direction. When the pinned layer pattern 226A has an upward magnetization direction, the magnetic correction layer pattern 228A may have a downward magnetization direction.

According to the semiconductor memory and the method for fabricating the same as described above, the third sidewall spacer 260 including a low-temperature amorphous silicon, a boron-doped low-temperature amorphous silicon, or a germanium-inserted low-temperature amorphous silicon, or a combination thereof may be formed on the sidewalls of the variable resistance element 220. Therefore, compressive stress in the sidewalls of variable resistance element 220 can be enhanced and/or the boron content in the sidewalls can be increased so as to prevent deterioration of perpendicular magnetic anisotropy of the variable resistance element 220 and improve WER0. As a result, characteristics of the variable resistance element 220 can be secured.

Meanwhile, in this implementation, since the second sidewall spacer 250 is formed in a thin thickness and has a porosity, silicon ions included in the third sidewall spacer 260 may penetrate into the first sidewall spacer 240A through the second sidewall spacer 250. In this case, the first sidewall spacer 240A may be modified due to the penetration of silicon ions. This will be exemplarily explained with reference to FIGS. 3A to 3G.

FIGS. 3A to 3G are cross-sectional views illustrating an exemplary semiconductor memory and a method for fabricating the same in accordance with an implementation of the present disclosure. A detailed description for substantially the same parts as the above implementation is omitted.

Figure 3A:
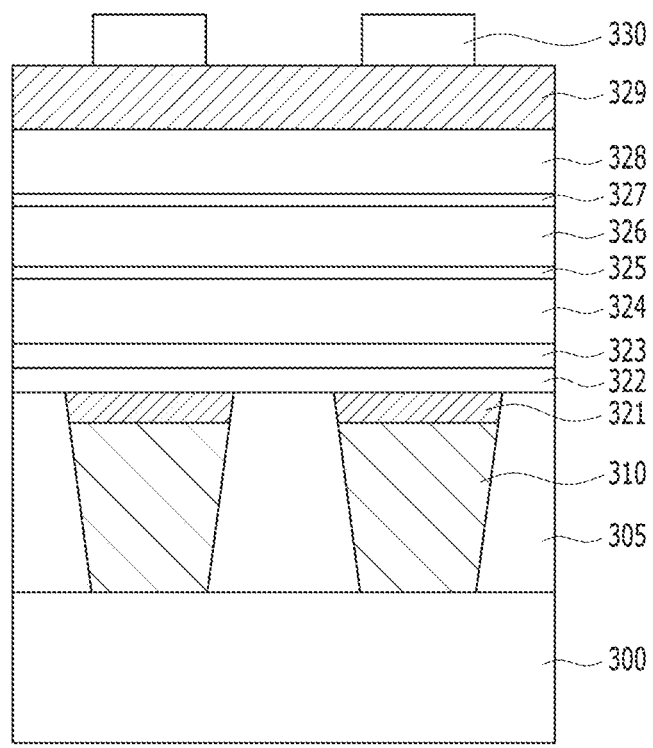
FIGS. 3A to 3G are cross-sectional views illustrating another exemplary semiconductor memory and a method for fabricating the same in accordance with an implementation of the present disclosure.

Referring to FIG. 3A, a first interlayer dielectric layer 305 may be formed over a substrate 300 in which predetermined structures are formed and selectively etched to form a hole exposing the substrate 300. A lower contact plug 310 filling a lower portion of the hole and coupled to a portion of the substrate 300 may be formed.

A lower electrode layer 321 disposed over the lower contact plug 310 and filling a remaining portion of the hole may be formed.

Material layers 322 to 329 may be formed over the first interlayer dielectric layer 305 and the lower electrode layer 321 for forming a remaining part of a variable resistance element. As shown in FIG. 3A, the variable resistance element includes the lower electrode layer 321 formed in the first interlayer dielectric layer 305 and the material layers 322 to 329 formed over the first interlayer dielectric layer 305. In this implementation, the material layers 322 to 329 may include a buffer layer 322, a seed layer 323, a free layer 324, a tunnel barrier layer 325, a pinned layer 326, an exchange coupling layer 327, a magnetic correction layer 328 and a capping layer 329 which are sequentially stacked.

A mask pattern 330 for patterning the variable resistance element may be formed over the capping layer 329.

Figure 3B:
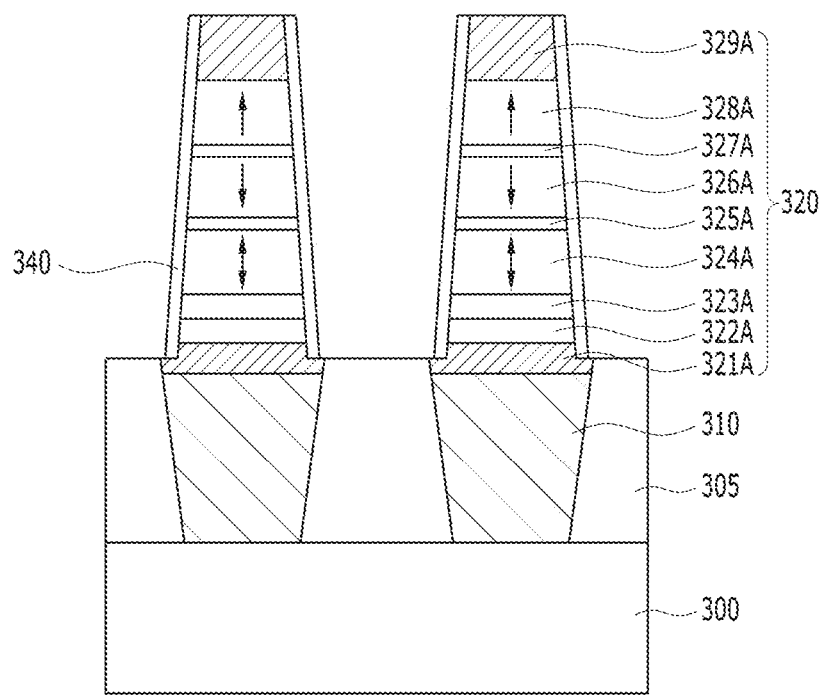

Referring to FIG. 3B, the capping layer 329, the magnetic correction layer 328, the exchange coupling layer 327, the pinned layer 326, the tunnel barrier layer 325, the free layer 324, the seed layer 323 and the buffer layer 322 may be etched using the mask pattern 330 as an etch barrier to form a stacked structure 322A to 329A including a buffer layer pattern 322A, a seed layer pattern 323A, a free layer pattern 324A, a tunnel barrier layer pattern 325A, a pinned layer pattern 326A, an exchange coupling layer pattern 327A, a magnetic correction layer pattern 328A and a capping layer pattern 329A. This etch process may be performed by a suitable etch process, for example, a physical etch process such as an IBE. Therefore, the stacked structure 322A to 329A may have a width increasing downwardly. Here, a width of a lower surface of the stacked structure 322A to 329A may be smaller than a width of an upper surface and thus a portion of the lower electrode layer 321 may be exposed by forming the stacked structure 322A to 329A. After a portion of the lower electrode layer 321 is etched, the remaining lower electrode layer may be referred to as a lower electrode 321A. As such, a variable resistance element 320 in which the electrode 321A, the buffer layer pattern 322A, the seed layer pattern 323A, the free layer pattern 324A, the tunnel barrier layer pattern 325A, the pinned layer pattern 326A, the exchange coupling layer pattern 327A, the magnetic correction layer pattern 328A and the capping layer pattern 329A are stacked may be formed.

During this etch process, etch byproducts may be redeposited on sidewalls of the variable resistance element 320 to form an initial sidewall spacer 340. The initial sidewall spacer 340 may mainly include a metal contained in the buffer layer pattern 322A and the lower electrode 321A, which are the layers etched at a later timing, i.e., the layers located below.

Figure 3C:
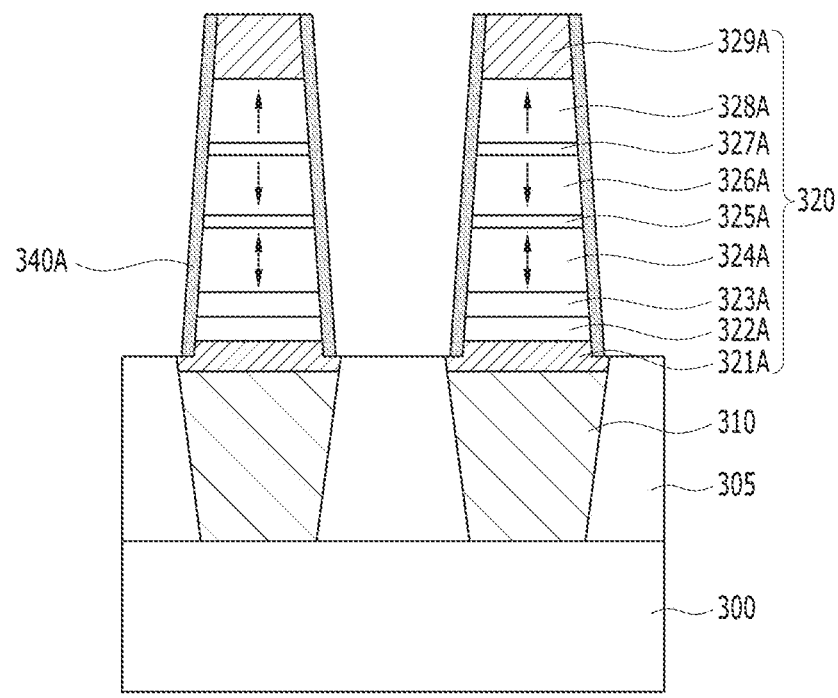

Referring to FIG. 3C, an oxidation process may be performed to convert the initial sidewall spacer 340 into a first sidewall spacer 340A including an insulating metal oxide.

Figure 3D:
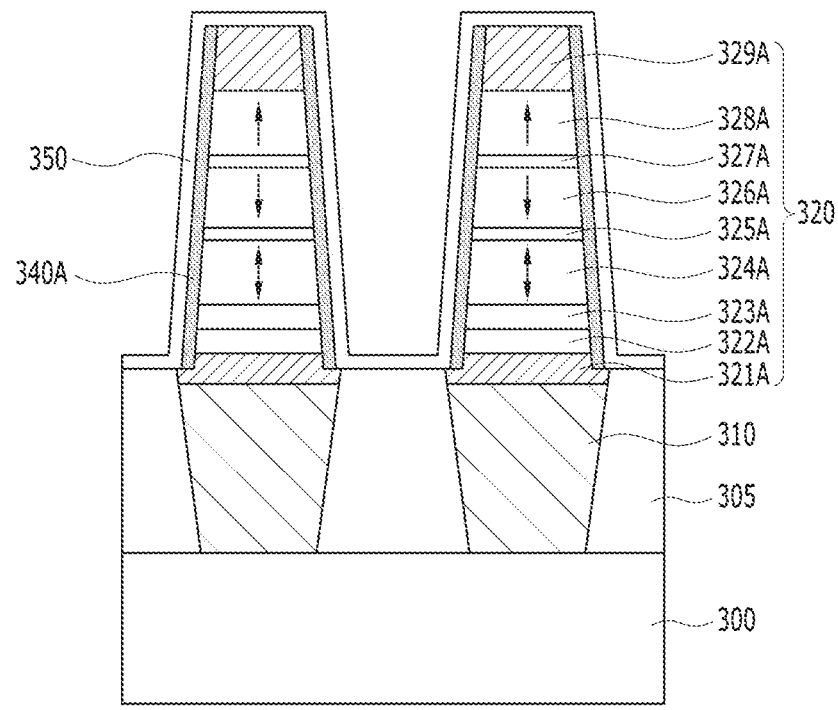

Referring to FIG. 3D, a second sidewall spacer 350 may be formed along a resultant structure in which the oxidation process has been performed. The second sidewall spacer 350 may include various insulating material such as a silicon oxide, or a silicon nitride, or a combination thereof. The second sidewall spacer 350 may include a porous film having a thin thickness.

Figure 3E:
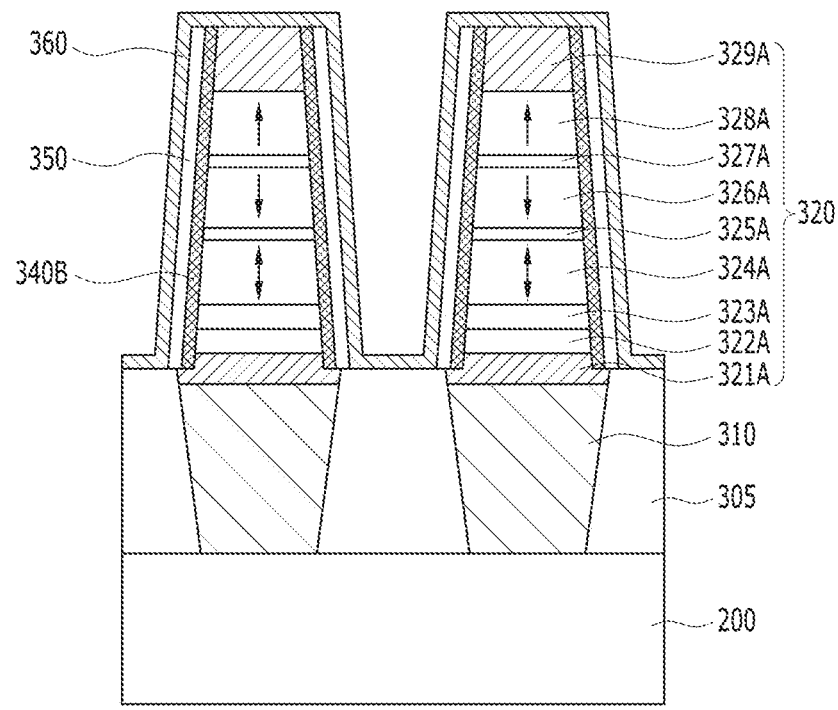

Referring to FIG. 3E, the first sidewall spacer 340A and the second sidewall spacer 350 may be disposed on sidewalls of the variable resistance element 320 by performing by a suitable etch process, for example, a blanket etch process, on the first sidewall spacer 340A and the second sidewall spacer 350.

A third sidewall spacer 360 may be formed along a resultant structure after the first sidewall spacer 340A and the second sidewall spacer 350 are disposed on sidewalls of the variable resistance element 320. The third sidewall spacer 360 may include low-temperature amorphous silicon, boron-doped low-temperature amorphous silicon, or germanium-inserted low-temperature amorphous silicon, or a combination thereof.

When the third sidewall spacer 360 is formed of or includes the low-temperature amorphous silicon, boron-doped low-temperature amorphous silicon, or germanium-inserted low-temperature amorphous silicon, or a combination thereof, since the second sidewall spacer 350 is a porous thin film, silicon ions contained in the third sidewall spacer 360 may penetrate into the first sidewall spacer 340A through the second sidewall spacer 350. As the silicon ions penetrate into the first sidewall spacer 340A, the first sidewall spacer 340A may be converted into a modified first sidewall spacer 340B including a silicon-containing metal oxide, for example, a metal silicate (MSiOx) which is derived from a metal oxide (MOx) contained in the first sidewall spacer 340A. Here, the metal (M) included in the first sidewall spacer 340A may mainly include a metal contained in the buffer layer pattern 322A and the lower electrode 321A. However, depending on the process, the metal (M) may further include a metal contained in a remaining part 323A to 329A of the variable resistance element 320. For example, the metal (M) may include Hf, Fe, Al, Mg, Zr, Nb, Mo, Ta, W, or Ti, or a combination thereof. The silicon-containing metal oxide, for example, the metal silicate (MSiOx) has high thermal stability compared to the metal (M). In this implementation, the third sidewall spacer 360 is formed of a material including low-temperature amorphous silicon so that the first sidewall spacer 340A including the metal oxide (MOx) can be changed into the modified first sidewall spacer 340B including the silicon-containing metal oxide, for example, the metal silicate (MSiOx). Therefore, it is possible to increase thermal stability of the variable resistance element 320 and improve characteristics of the variable resistance element 320.

Figure 3F:
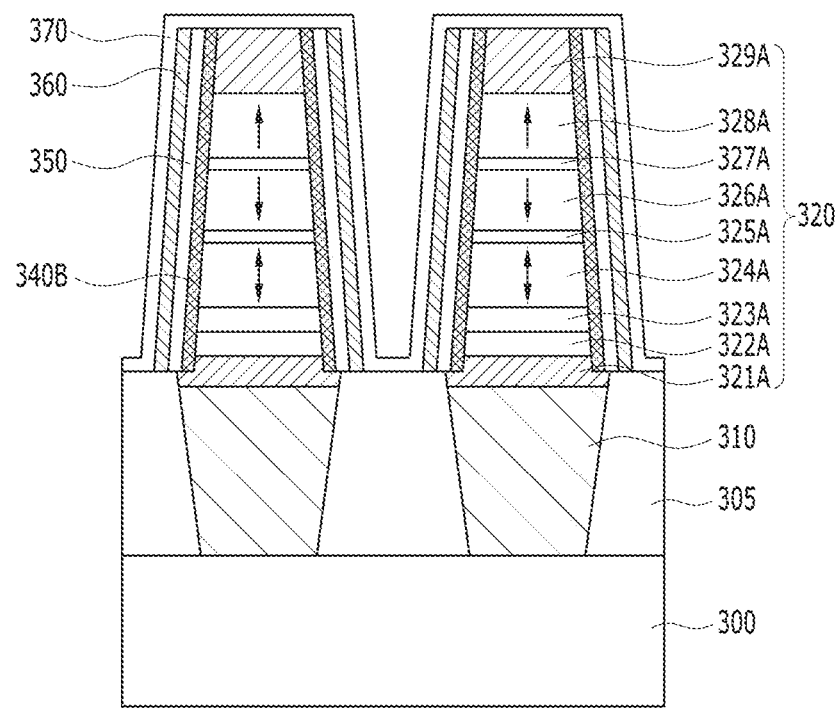

Referring to FIG. 3F, an etch process, for example, a blanket etch process, may be performed on the modified first sidewall spacer 340B, the second sidewall spacer 350 and the third sidewall spacer 360 so that the modified first sidewall spacer 340B, the second sidewall spacer 350 and the third sidewall spacer 360 may be disposed on the sidewalls of the stacked structure 321A to 329A.

In another implementation, although it is not shown, the modified first sidewall spacer 340B, the second sidewall spacer 350 and the third sidewall spacer 360 are located on the sidewalls of the stacked structure 321A to 329A by using a technique different from the blanket etch process. For example, the blanket etch process may not be performed on the modified first sidewall spacer 340B, the second sidewall spacer 350 and the third sidewall spacer 360. In this case, the modified first sidewall spacer 340B and the second sidewall spacer 350 may be disposed on the sidewalls of the variable resistance element 320 and the third sidewall spacer 360 may be disposed along a resultant structure including the modified first sidewall spacer 340B and the second sidewall spacer 350.

A protective layer 370 may be formed along a resultant structure. The protective layer 370 may serve to protect the variable resistance element 320 and be formed of or include an insulating material such as a silicon nitride.

Figure 3G:
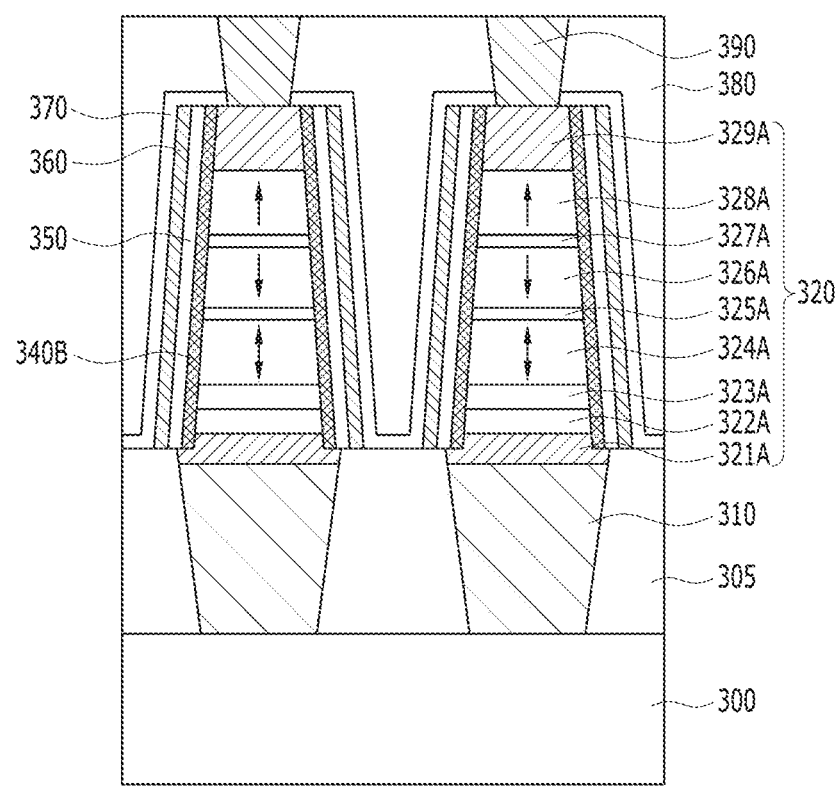

Referring to FIG. 3G, a second interlayer dielectric layer 380 covering the structure of FIG. 3F may be formed and an upper contact plug 390 passing through the second interlayer dielectric layer 380 and electrically coupled to the variable resistance element 320, for example, an upper end of the variable resistance element 320, may be formed. For example, the upper contact plug 390 is electrically coupled to the capping layer pattern 329A.

Although it is not shown, lines that are electrically coupled to the upper contact plug 390, for example, bit lines, may be formed over the second interlayer dielectric layer 380 and the upper contact plug 390.

The semiconductor memory shown in FIG. 3G may be fabricated through the process described above.

Referring back to FIG. 3G, the semiconductor memory in accordance with the implementation of the present disclosure may include the lower contact plug 310 disposed over the substrate 300 and coupled to a portion of the substrate 300, the lower electrode 321A of the variable resistance element 320 disposed over the lower contact plug 310 and coupled to the lower contact plug 310, the remaining part 322A to 329A of the variable resistance element 320 disposed over the lower electrode 321A and coupled to the lower electrode 321A, the modified first sidewall spacer 340B, the second sidewall spacer 350 and the third sidewall spacer 360 formed on the sidewalls of the variable resistance element 320 and the protective layer 370 covering the variable resistance element 320.

Here, the lower portion of the lower electrode 321A may be buried in the first interlayer dielectric layer 305 and the upper portion of the lower electrode 321A may protrude from the first interlayer dielectric layer 305. The upper portion of the lower electrode 321A may have sidewalls that are aligned with the stacked structure 322A to 329A, while the lower portion of the lower electrode 321A may have sidewalls that are not aligned with the stacked structure 322A to 329A.

The remaining part 322A to 329A of the variable resistance element 320 may include the buffer layer pattern 322A, the seed layer pattern 323A, the free layer pattern 324A, the tunnel barrier layer pattern 325A, the pinned layer pattern 326A, the exchange coupling layer pattern 327A, the magnetic correction layer pattern 328A and the capping layer pattern 329A.

The modified first sidewall spacer 340B may include a silicon-containing metal oxide, for example, a metal silicate (MSiOx). The metal (M) may be the same metal included in the lower electrode 321A and/or the buffer layer pattern 322A. However, depending on the process, the metal (M) may further include the metal contained in the remaining part 322A to 329A of the variable resistance element 320. For example, the metal (M) may include Hf, Fe, Al, Mg, Zr, Nb, Mo, Ta, W, or Ti, or a combination thereof. The second sidewall spacer 250 may include various insulating materials such as a silicon oxide, or a silicon nitride or a combination thereof. The third sidewall spacer 260 may include a low-temperature amorphous silicon, a boron-doped low-temperature amorphous silicon, or a germanium-inserted low-temperature amorphous silicon, or a combination thereof.

According to the semiconductor memory and the method for fabricating the same as described above, in addition to the effect which is obtained by the implementation shown in FIGS. 2A to 2G, thermal stability of the variable resistance element 320 can be increased and thus characteristics of the variable resistance element 320 can be improved by including the modified first sidewall spacer 340B which includes the silicon-containing metal oxide, that is, the metal silicate (MSiOx).

Meanwhile, in the implementation shown in FIGS. 2A to 2G and the implementation shown in FIGS. 3A to 3G, the lower contact plug and the lower electrode layer are formed in the same hole as each other. In another implementation, the lower contact plug and the lower electrode layer may be formed in separate holes from each other. This will be exemplarily explained with reference to FIGS. 4A to 4F.

FIGS. 4A to 4F are cross-sectional views illustrating an exemplary semiconductor memory and a method for fabricating the same in accordance with an implementation of the present disclosure. A detailed description for substantially the same parts as the above implementation is omitted.

Figure 4A:
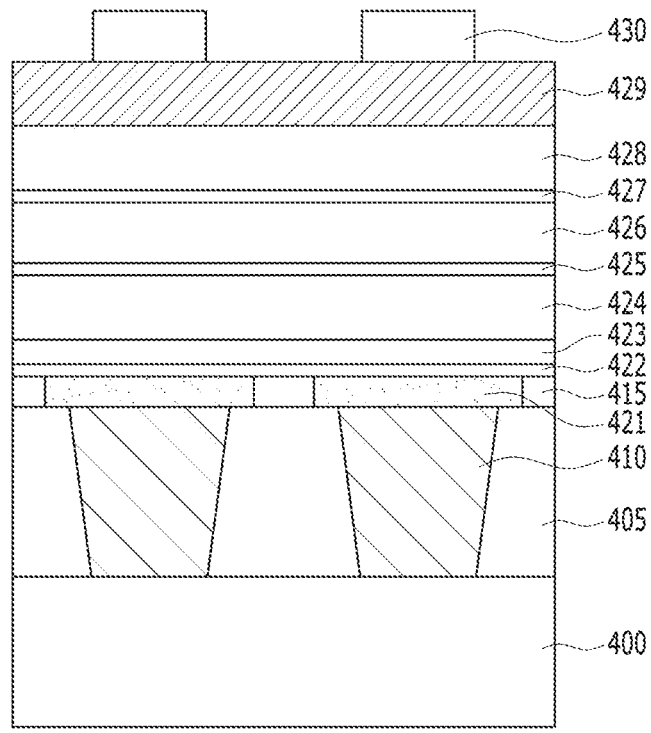
FIGS. 4A to 4F are cross-sectional views illustrating another exemplary semiconductor memory and a method for fabricating the same in accordance with an implementation of the present disclosure.

Referring to FIG. 4A, a first interlayer dielectric layer 405 may be formed over a substrate 400 in which a required structure, for example, a switching device (not shown) is formed. The first interlayer dielectric layer 405 may include various insulating materials such as a silicon oxide, or a silicon nitride or a combination thereof.

A lower contact plug 410 passing through the first interlayer dielectric layer 405 and coupled to a portion of the substrate 400, for example, an end of the switching device may be formed. The lower contact plug 410 may be formed by selectively etching the first interlayer dielectric layer 405 to form a contact hole exposing a portion of the substrate 400, depositing a conductive material in a thickness that sufficiently fills the contact hole and performing a planarization process such as a CMP process until an upper surface of the first interlayer dielectric layer 405 is exposed.

A second interlayer dielectric layer 415 may be formed over the first interlayer dielectric layer 405 and the lower contact plug 410. A lower electrode layer 421 passing through the second interlayer dielectric layer 415 and coupled to the lower contact plug 410 may be formed. The lower electrode layer 421 may form a part of the variable resistance element and thus be distinguished from the lower contact plug 410 that is coupled to a lower end of the variable resistance element in order to connect the variable resistance element to another device. The lower electrode layer 421 may be formed by selectively etching the second interlayer dielectric layer 415 to form a contact hole exposing the lower contact plug 410, depositing a conductive material in a thickness that sufficiently fills the contact hole and performing a planarization process such as a CMP process until an upper surface of the second interlayer dielectric layer 415 is exposed. As a result, the lower electrode layer 421 may have a planarized upper surface. The lower electrode layer 421 is buried in the contact hole in order to reduce the number of layers to be etched during an etch process for forming the variable resistance element, thereby facilitating the etch process.

Material layers 422 to 429 for forming a remaining part of the variable resistance element may be formed over the second interlayer dielectric layer 415 and the lower electrode layer 421. As shown in FIG. 4A, the variable resistance element includes the lower electrode layer 421 formed in the second interlayer dielectric layer 415 and the material layers 422 to 429 formed over the second interlayer dielectric layer 415. The material layers 422 to 429 may include a buffer layer 422, a seed layer 423, a free layer 424, a tunnel barrier layer 425, a pinned layer 426, an exchange coupling layer 427, a magnetic correction layer 428 and a capping layer 429 which are sequentially stacked.

A mask pattern 430 for patterning the variable resistance element may be formed over the capping layer 429.

Figure 4B:
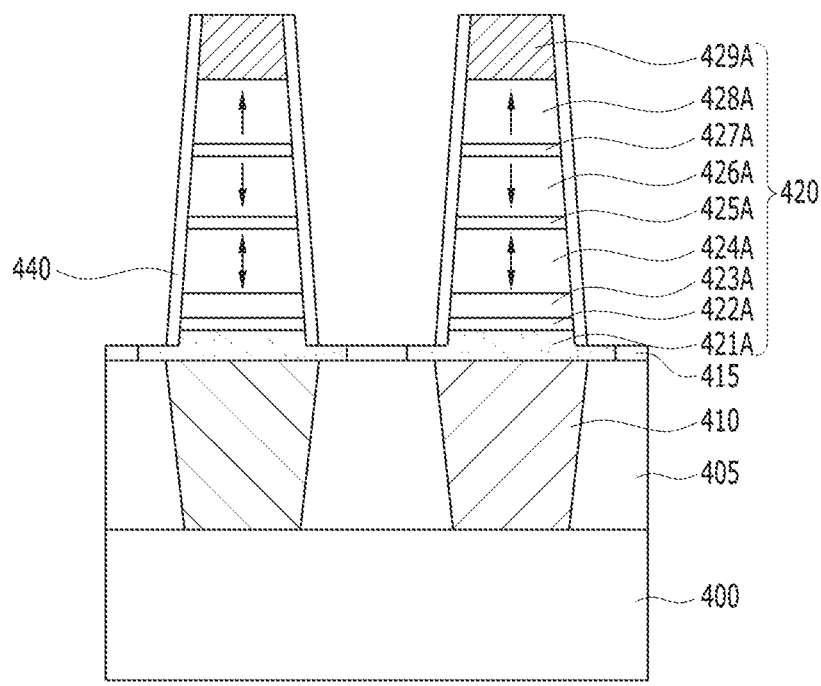

Referring to FIG. 4B, the capping layer 429, the magnetic correction layer 428, the exchange coupling layer 427, the pinned layer 426, the tunnel barrier layer 425, the free layer 424, the seed layer 423 and the buffer layer 422 are etched using the mask pattern 430 as an etch barrier to form a stacked structure 422A to 429A including a buffer layer pattern 422A, a seed layer pattern 423A, a free layer pattern 424A, a tunnel barrier layer pattern 425A, a pinned layer pattern 426A, an exchange coupling layer pattern 427A, a magnetic correction layer pattern 428A and a capping layer pattern 429A. This etch process may be performed by a method having a strong physical etching characteristic such as an Ion Beam Etching (IBE) method. As such, the stacked structure 422A to 429A may have a shape where a width is increased downwardly. Here, a width of a lower surface of the stacked structure 422A to 429A may be narrower than that of an upper surface of the lower electrode layer 421 and thus, a portion of the upper surface of the lower electrode layer 421 may be exposed by forming the stacked structure 422A to 429A.

During this etch process, an over etch process may be performed to separate the adjacent stacked structures 422A to 429A, and as a result, portions of the lower electrode layer 421 and the second interlayer dielectric layer 415 that are exposed by forming the stacked structure 422A to 429A may be etched. After a portion of the lower electrode layer 421 is etched, the remaining lower electrode layer may be referred to as a lower electrode 421A.

A lower portion of the lower electrode 421A may be located in the second interlayer dielectric layer 415 and an upper portion of the lower electrode 421A may protrude from the second interlayer dielectric layer 415. Moreover, the upper portion of the lower electrode 421A may have sidewalls which are aligned with the stacked structure 422A to 429A, while the lower portion of the lower electrode 421A may have sidewalls which are not aligned with the stacked structure 422A to 429A. The width of the upper portion of the lower electrode 421A is smaller than the width of the lower portion of the lower electrode 421A. During this etch process or by a separate removal process, the mask pattern 430 may be removed. Alternatively, although it is not shown, when the mask pattern 430 includes a conductive material, a portion of the mask pattern 430 may remain.

During this etch process, etch byproducts may be redeposited on sidewalls of the variable resistance element 420 to form an initial sidewall spacer 440. The initial sidewall spacer 440 may include a metal whose oxide has an insulating property.

Figure 4C:
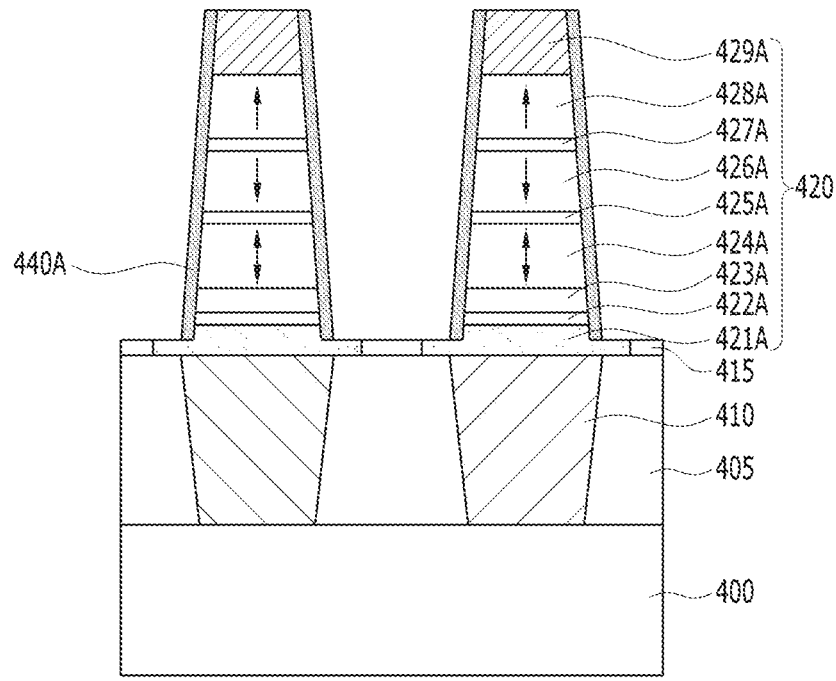

Referring to FIG. 4C, an oxidation process may be performed to convert the initial sidewall spacer 440 into a first sidewall spacer 440A including an insulating metal oxide.

Figure 4D:
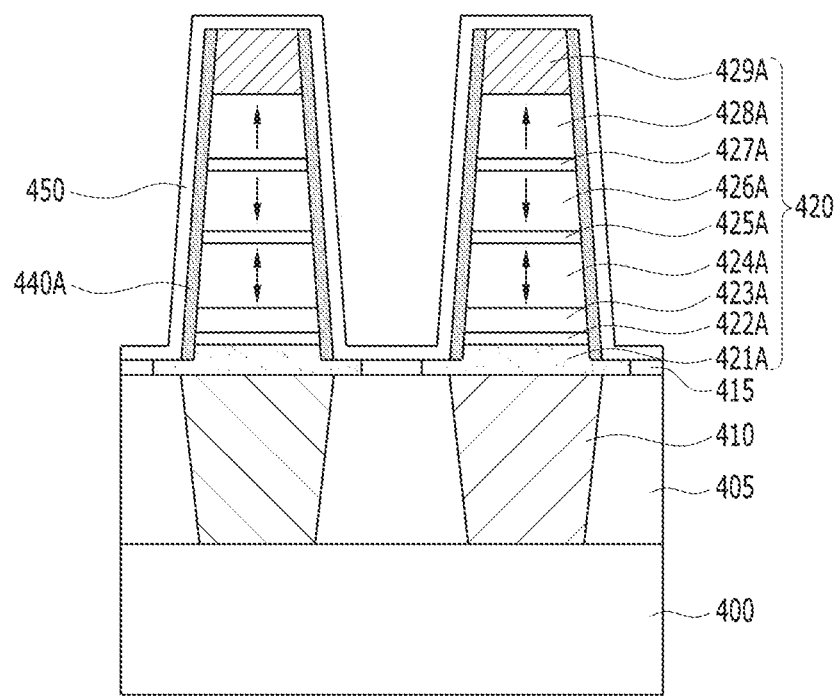

Referring to FIG. 4D, after the oxidation process, a second sidewall spacer 450 may be formed along a resultant structure. The second sidewall spacer 450 may include various insulating materials such as a silicon nitride. The second sidewall spacer 450 includes a porous thin film.

Figure 4E:
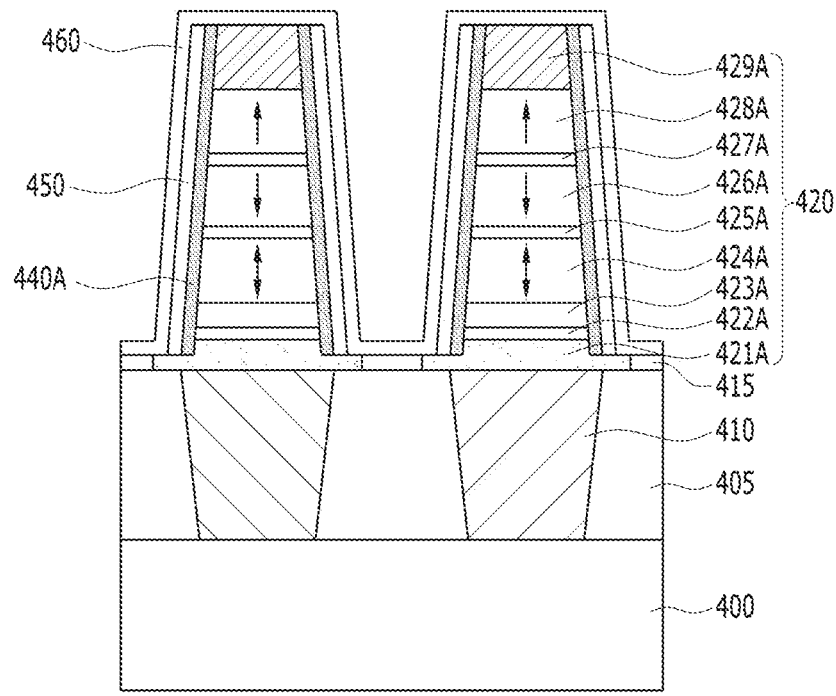

Referring to FIG. 4E, an etch process, for example, a blanket etch process, may be performed on the first sidewall spacer 440A and the second sidewall spacer 450 so that the first sidewall spacer 440A and the second sidewall spacer 450 may be disposed on the sidewalls of the variable resistance element 420.

A third sidewall spacer 460 may be formed along a resultant structure after the first sidewall spacer 440A and the second sidewall spacer 450 are disposed on the sidewalls of the variable resistance element 420. The third sidewall spacer 460 may include a low-temperature amorphous silicon, a boron-doped low-temperature amorphous silicon, or a germanium-inserted low-temperature amorphous silicon, or a combination thereof.

Figure 4F:
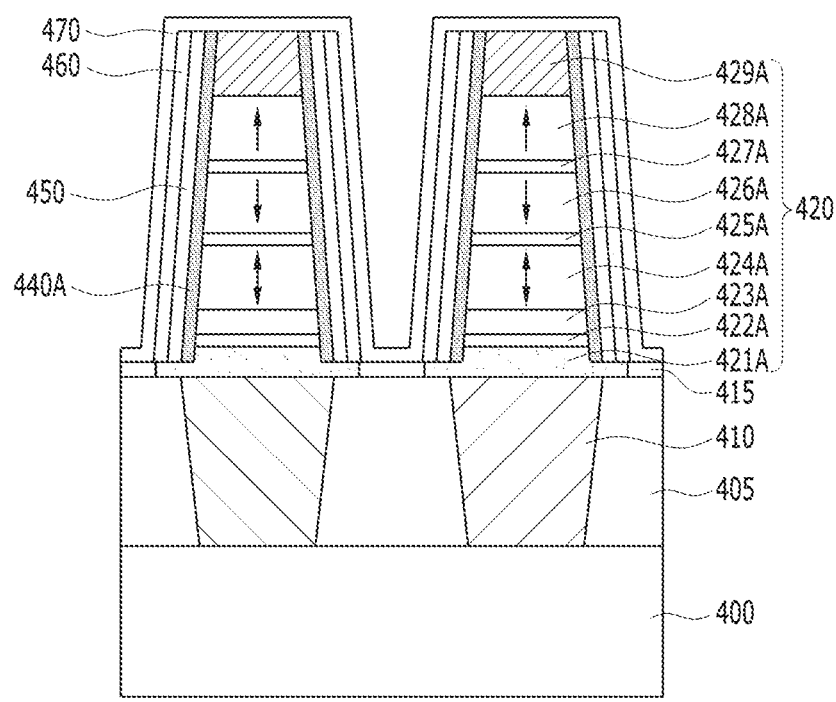

Referring to FIG. 4F, an etch process, for example, a blanket etch process, may be performed on the first sidewall spacer 440A, the second sidewall spacer 450 and the third sidewall spacer 460 so that the first sidewall spacer 440A, the second sidewall spacer 450 and the third sidewall spacer 460 may be disposed on the sidewalls of the variable resistance element 420.

In another implementation, although it is not shown, the first sidewall spacer 440A, the second sidewall spacer 450 and the third sidewall spacer 460 are located on the sidewalls of the variable resistance element 420 by using a technique different from the blanket etch process. For example, the blanket etch process may not be performed on the first sidewall spacer 440A, the second sidewall spacer 450 and the third sidewall spacer 460. In this case, the first sidewall spacer 440A and the second sidewall spacer 450 may be disposed on the sidewalls of the variable resistance element 420 and the third sidewall spacer 460 may be disposed along a resultant structure including the first sidewall spacer 440A and the second sidewall spacer 450.

A protective layer 470 may be formed along a resultant structure. The protective layer 470 may include an insulating material such as a silicon nitride.

Although it is not shown, an interlayer dielectric layer covering the structure of FIG. 4F may be formed and then an upper contact plug passing through the interlayer dielectric layer and coupled to the variable resistance element 420, for example, an upper end of the variable resistance element 420, may be formed.

The semiconductor memory shown in FIG. 4F may be fabricated through the process described above.

Referring back to FIG. 4F, the semiconductor memory in accordance with the implementation of the present disclosure may include the lower contact plug 410 disposed over the substrate 400 and coupled to a portion of the substrate 400, the lower electrode 421A of the variable resistance element 420 disposed over the lower contact plug 410 and coupled to lower contact plug 410, a remaining part 422A to 429A of the variable resistance element 420 disposed over the lower electrode 421A and coupled to the lower electrode 421A, the first sidewall spacer 440A, the second sidewall spacer 450 and the third sidewall spacer 460 formed on the sidewalls of the variable resistance element 420, and the protective layer 470 covering the variable resistance element 420.

The remaining part 422A to 429A may include the buffer layer pattern 422A, the seed layer pattern 423A, the free layer pattern 424A, the tunnel barrier layer pattern 425A, the pinned layer pattern 426A, the exchange coupling layer pattern 427A, the magnetic correction layer pattern 428A and the capping layer pattern 429A.

Here, the upper portion of the lower electrode 421A may protrude from the second interlayer dielectric layer 415 and have sidewalls aligned with the remaining part 422A to 429A of the variable resistance element 420. The lower portion of the lower electrode 421A may be buried in the second interlayer dielectric layer 415. The lower portion of the lower electrode 421A may have a greater width than a width of the upper portion of the lower electrode 421A so that sidewalls of the lower electrode 421A may not be aligned with the remaining part 422A to 429A of the variable resistance element 420.

The first sidewall spacer 440A may include a metal oxide and have an insulating characteristic. The metal included in the first sidewall spacer 440A may be derived from the lower electrode 421A and/or the buffer layer pattern 422A. According to the process, the first sidewall spacer 440A may further include the metal included in the remaining part 423A to 429A of the variable resistance element 420. The second sidewall spacer 450 may include various insulating materials such as a silicon oxide, or a silicon nitride or a combination thereof. The third sidewall spacer 460 may include a low-temperature amorphous silicon, a boron-doped low-temperature amorphous silicon, or a germanium-inserted low-temperature amorphous silicon, or a combination thereof.

In this implementation, since the second sidewall spacer 450 includes a porous thin film, silicon ions included in the third spacer 460 may penetrate into the first sidewall spacer 440A through the second sidewall spacer 450 so that the first sidewall spacer 440A may be modified.

FIGS. 5A to 5F are cross-sectional views illustrating an exemplary semiconductor memory and a method for fabricating the same in accordance with an implementation of the present disclosure.

Figure 5A:
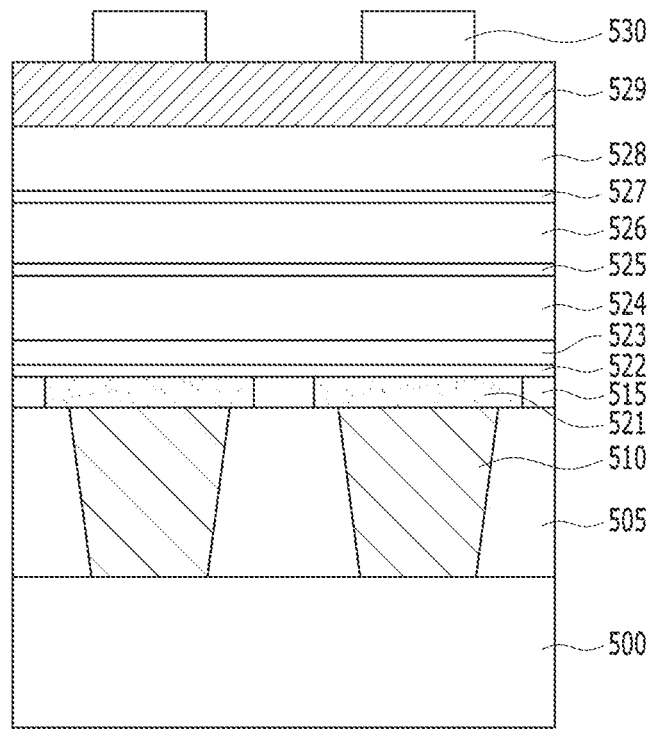
FIGS. 5A to 5F are cross-sectional views illustrating another exemplary semiconductor memory and a method for fabricating the same in accordance with an implementation of the present disclosure.

Referring to FIG. 5A, a first interlayer dielectric layer 505 may be formed over a substrate 500 in which required structures (not shown) are formed and a lower contact plug 510 passing through the first interlayer dielectric layer 505 and coupled to a portion of the substrate 500 may be formed.

A second interlayer dielectric layer 515 may be formed over the first interlayer dielectric layer 505 and the lower contact plug 510 and a lower electrode layer 521 passing through the second interlayer dielectric layer 515 and coupled to the lower contact plug 510 may be formed. The lower electrode layer 521 may include a single-layer structure or a multi-layer structure including a metal-containing material such as a metal, or a metal nitride or a combination thereof.

Material layers 522 to 529 for forming a remaining part of the variable resistance element may be formed over the second interlayer dielectric layer 515 and the lower electrode layer 521. As shown in FIG. 5A, the variable resistance element includes the lower electrode layer 521 formed in the second interlayer dielectric layer 515 and the material layers 522 to 529 formed over the second interlayer dielectric layer 515. The material layers 522 to 529 may include a buffer layer 522, a seed layer 523, a free layer 524, a tunnel barrier layer 525, a pinned layer 526, an exchange coupling layer 527, a magnetic correction layer 528 and a capping layer 529 which are sequentially stacked.

A mask pattern 530 for patterning the variable resistance element may be formed over the capping layer 529.

Figure 5B:
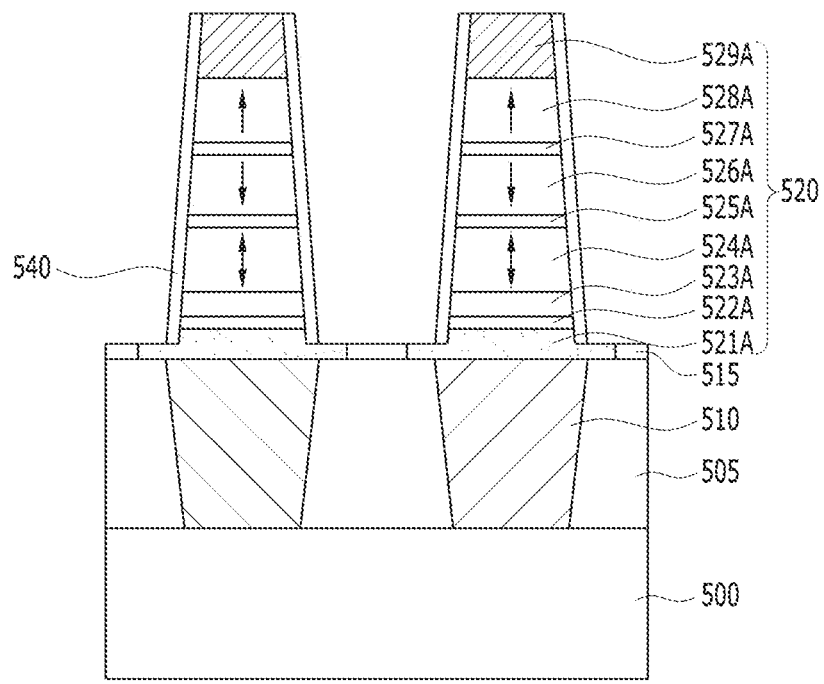

Referring to FIG. 5B, the capping layer 529, the magnetic correction layer 528, the exchange coupling layer 527, the pinned layer 526, the tunnel barrier layer 525, the free layer 524, the seed layer 523 and the buffer layer 522 may be etched using the mask pattern 530 as an etch barrier to form a stacked structure 522A to 529A including a buffer layer pattern 522A, a seed layer pattern 523A, a free layer pattern 524A, a tunnel barrier layer pattern 525A, a pinned layer pattern 526A, an exchange coupling layer pattern 527A, a magnetic correction layer pattern 528A and a capping layer pattern 529A. This etch process may be performed by a suitable etch process, for example, a physical etch process such as IBE. Here, a width of a lower surface of the stacked structure 522A to 529A may be smaller than a width of an upper surface of the lower electrode layer 521. Therefore, a portion of the upper surface of the lower electrode layer 521 may be exposed by forming the stacked structure 522A to 529A.

During this etch process, an over etch process may be performed to separate the adjacent stacked structures 522A to 529A, and as a result, portions of the lower electrode layer 521 and the second interlayer dielectric layer 515 that are exposed by forming the stacked structure 522A to 529A may be etched. After a portion of the lower electrode layer 521 is etched, the remaining lower electrode layer may be referred to as a lower electrode 521A.

A lower portion of the lower electrode 521A may be buried in the second interlayer dielectric layer 515 and an upper portion of the lower electrode 521A may protrude from the second interlayer dielectric layer 515. The upper portion of the lower electrode 521A may have sidewalls that are aligned with the stacked structure 522A to 529A, while the lower portion of the lower electrode 521A may have sidewalls that are not aligned with the stacked structure 522A to 529A. The upper portion of the lower electrode 521A has a width smaller than that of the lower portion of the lower electrode 521A. During this etch process or by a separate removal process, the mask pattern 530 may be removed.

During this etch process, etch byproducts may be redeposited on sidewalls of the variable resistance element 520 so that an initial sidewall spacer 540 may be formed. The initial spacer 540 may include a metal.

Figure 5C:
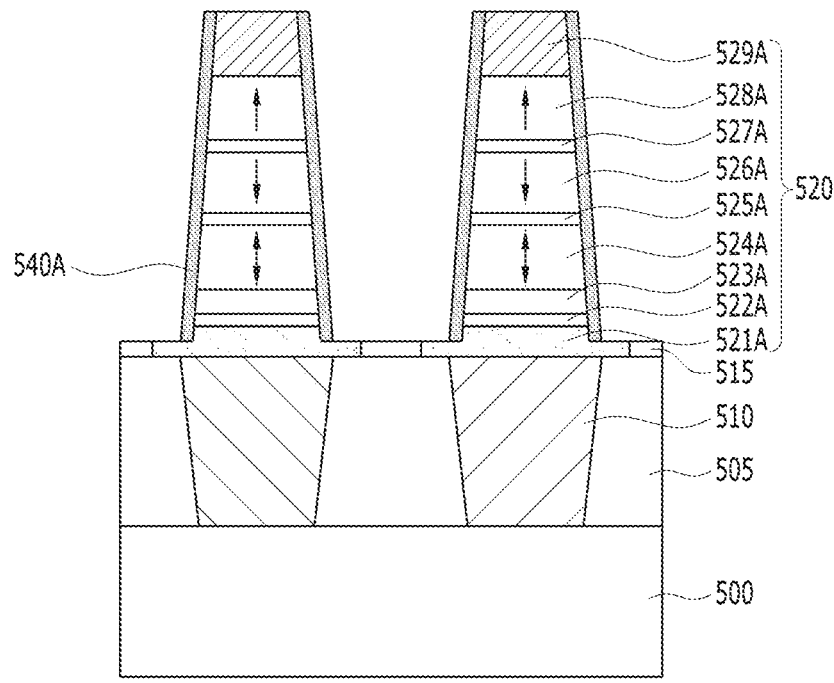

Referring to FIG. 5C, an oxidation process may be performed to convert the initial sidewall spacer 540 into a first sidewall spacer 540A including an insulating metal oxide.

Figure 5D:
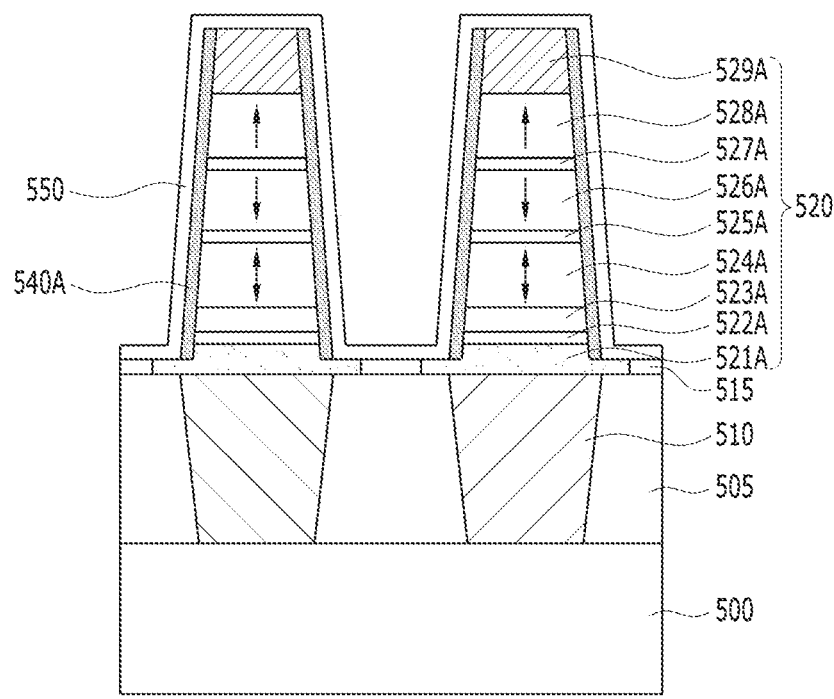

Referring to FIG. 5D, a second sidewall spacer 550 may be formed along a resultant structure in which the oxidation process has been performed second sidewall spacer 550. The second sidewall spacer 550 may include various insulating materials such as a silicon nitride. The second sidewall spacer 550 may include a porous film having a thin thickness.

Figure 5E:
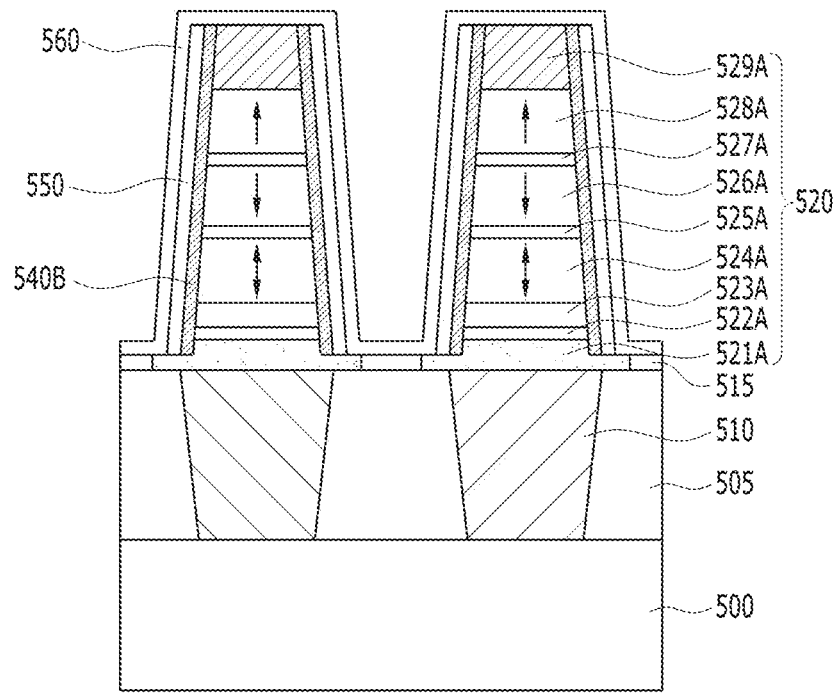

Referring to FIG. 5E, an etch process, for example, a blanket etch process, may be performed on the first sidewall spacer 540A and the second sidewall spacer 550 so that the first sidewall spacer 540A and the second sidewall spacer 550 may be disposed on the sidewalls of the variable resistance element 520.

A third sidewall spacer 560 may be formed along a resultant structure after the first sidewall spacer 540A and the second sidewall spacer 550 are disposed on sidewalls of the variable resistance element 520. The third sidewall spacer 560 may include a low-temperature amorphous silicon, a boron-doped low-temperature amorphous silicon, or a germanium-inserted low-temperature amorphous silicon, or a combination thereof.

When the third sidewall spacer 560 is formed of or includes a low-temperature amorphous silicon, a boron-doped low-temperature amorphous silicon, or a germanium-inserted low-temperature amorphous silicon, or a combination thereof, since the second sidewall spacer 550 is a porous thin film, a silicon ion included in the third sidewall spacer 560 may penetrate into the first sidewall spacer 540A through the second sidewall spacer 550. As the silicon ion penetrates into the first sidewall spacer 540A, the first sidewall spacer 540A including a metal oxide (MOx) may be converted into a modified first sidewall spacer 540B including a silicon-containing metal oxide, that is, a metal silicate (MSiOx). Here, the first sidewall spacer 540A may mainly include the same metals as those in the buffer layer pattern 522A and the lower electrode layer 521. However, according to the process, it may be possible that the first sidewall spacer 540A further include a metal contained in the remaining part 523A to 529A of the variable resistance element 520. For example, the metal (M) in the first sidewall spacer 540A may include Hf, Fe, Al, Mg, Zr, Nb, Mo, Ta, W, or Ti, or a combination thereof. The third sidewall spacer 560 is formed of or includes a material including low-temperature amorphous silicon and thus, the first sidewall spacer 540A is modified as the silicon ions contained in the third sidewall spacer 560 penetrate into the first sidewall spacer 540A through the second sidewall spacer 540B. For example, the first sidewall spacer 540A including the metal oxide (MOx) is converted into the modified first sidewall spacer 540B including the silicon-containing metal oxide, for example, the metal silicate (MSiOx). The silicon-containing metal oxide, for example, the metal silicate (MSiOx), has a high thermal stability compared to the metal (M). Therefore, it is possible to increase thermal stability of the variable resistance element 520 and improve characteristics of the variable resistance element 520.

Figure 5F:
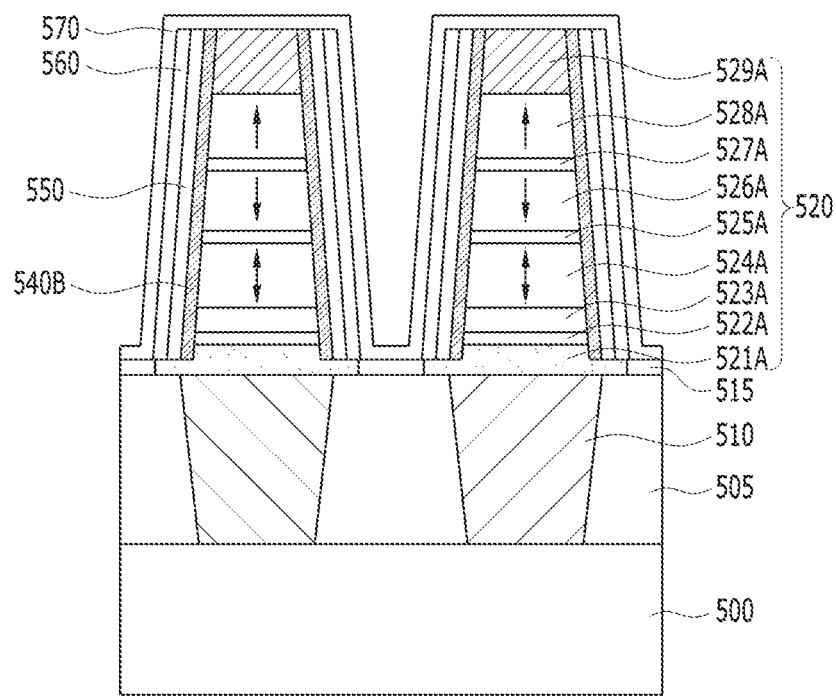

Referring to FIG. 5F, an etch process, for example, a blanket etch process, may be performed on the modified first sidewall spacer 540B, the second sidewall spacer 550 and the third sidewall spacer 560 so that the modified first sidewall spacer 540B, the second sidewall spacer 550 and the third sidewall spacer 560 may be disposed on the sidewalls of the variable resistance element 520.

In another implementation, although it is not shown, the modified first sidewall spacer 540B, the second sidewall spacer 550 and the third sidewall spacer 560 are located on the sidewalls of the variable resistance element 520 by using a technique different from the blanket etch process. For example, the blanket etch process may not be performed on the modified first sidewall spacer 540B, the second sidewall spacer 550 and the third sidewall spacer 560. In this case, the modified first sidewall spacer 540B and the second sidewall spacer 550 may be disposed on the sidewalls of the variable resistance element 520 and the third sidewall spacer 560 may be disposed along a resultant structure including the modified first sidewall spacer 540B and the second sidewall spacer 550.

A protective layer 570 may be formed along a resultant structure. The protective layer 570 may serve to protect the variable resistance element 520 and be formed of or include an insulating material such as a silicon nitride.

Although it is not shown, an interlayer dielectric layer covering the structure of FIG. 5F may be formed and an upper contact plug passing through the interlayer dielectric layer and coupled to the variable resistance element 520, for example, an upper end of the variable resistance element 520, may be formed.

The semiconductor memory shown in FIG. 5F may be fabricated through the process described above.

Referring back to FIG. 5F, the semiconductor memory in accordance with the implementation of the present disclosure may include the lower contact plug 510 disposed over the substrate 500 and coupled to a portion of the substrate 500, the lower electrode 521A of the variable resistance element 520 disposed over the lower contact plug 510 and coupled to the lower contact plug 510, the remaining part 522A to 529A of the variable resistance element 520 disposed over the lower electrode 521A and coupled to the lower electrode 521A, the modified first sidewall spacer 540B, the second sidewall spacer 550 and the third sidewall spacer 560 formed on the sidewalls of the variable resistance element 520 and the protective layer 570 covering the variable resistance element 520.

The remaining part 522A to 529A may include the buffer layer pattern 522A, the seed layer pattern 523A, the free layer pattern 524A, the tunnel barrier layer pattern 525A, the pinned layer pattern 526A, the exchange coupling layer pattern 527A, the magnetic correction layer pattern 528A and the capping layer pattern 529A.

Here, the upper portion of the lower electrode 521A may protrude from the second interlayer dielectric layer 515 and have sidewalls which are aligned with the remaining part 522A to 529A of the variable resistance element 520. The lower portion of the lower electrode 521A may be buried in the second interlayer dielectric layer 515 and have a greater width than a width of the upper portion of the lower electrode 521A. Thus, the lower portion of the lower electrode 521A may have sidewalls which are not aligned with the remaining part 522A to 529A of the variable resistance element 520.

The modified first sidewall spacer 540B may include a silicon-containing metal oxide, for example, a metal silicate (MSiOx). The metal (M) may be the metal contained in the lower electrode 521A and/or the buffer layer pattern 522A. According to the process, the metal (M) may further include the metal contained in the remaining part 522A to 529A of the variable resistance element 520. For example, the metal (M) may include Hf, Fe, Al, Mg, Zr, Nb, Mo, Ta, W, or Ti, or a combination thereof. The second sidewall spacer 550 may include various insulating materials such as a silicon oxide, a silicon nitride or a combination thereof. The third sidewall spacer 560 may include a low-temperature amorphous silicon, a boron-doped low-temperature amorphous silicon, or a germanium-inserted low-temperature amorphous silicon, or a combination thereof.

Figure 6A:
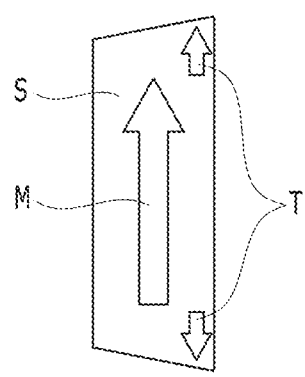
FIGS. 6A and 6B are schematic views for illustrating a magnetostriction effect according to stress applied to a sidewall of an MTJ (Magnetic Tunnel Junction) structure.
Figure 6B:
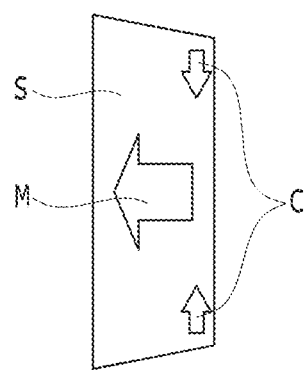

FIGS. 6A and 6B are schematic views for illustrating a magnetostriction effect according to stress applied to a sidewall of an MTJ (Magnetic Tunnel Junction) structure FIG. 6A schematically shows the sidewall where a tensile stress is applied. In FIG. 6A, S represents the sidewall of the MTJ, M represents a magnetic anisotropy and T represents a tensile stress. As shown in FIG. 6A, when the tensile stress T that pulls the sidewall S in two opposite directions is applied to the sidewall S of the MTJ structure, a direction of a magnetic anisotropy M in the sidewall S of the MTJ structure is perpendicular to an interface of the layers included in the MTJ structure.

FIG. 6B schematically shows the sidewall where a compressive stress is applied. In FIG. 6B, S represents the sidewall of the MTJ, M represents a magnetic anisotropy and C represents a compressive stress. As shown in FIG. 6B, when the compressive stress C that compresses the sidewall S of the MTJ structure is applied to the sidewall S of the MTJ structure, a direction of a magnetic anisotropy M in the sidewall S of the MTJ structure is parallel to an interface of the layers included in the MTJ structure.

In accordance with the implementation, the spacer including low-temperature amorphous silicon is formed on the sidewalls of the variable resistance element so that the spacer can exhibit a high compressive stress of 0.5 to 1.5 GPa and thus, a direction of magnetic anisotropy in the sidewalls can be changed from a vertical direction to a horizontal direction. Such stress engineering can resolve deterioration of perpendicular magnetic anisotropy (Hk) in the lower portion of the variable resistance element, thereby improving WER0. As a result, it is possible to improve characteristics of the variable resistance element.

The above and other memory circuits or semiconductor devices based on the disclosed technology can be used in a range of devices or systems. FIGS. 7 to 11 provide some examples of devices or systems that can implement the memory circuits disclosed herein.

Figure 7:
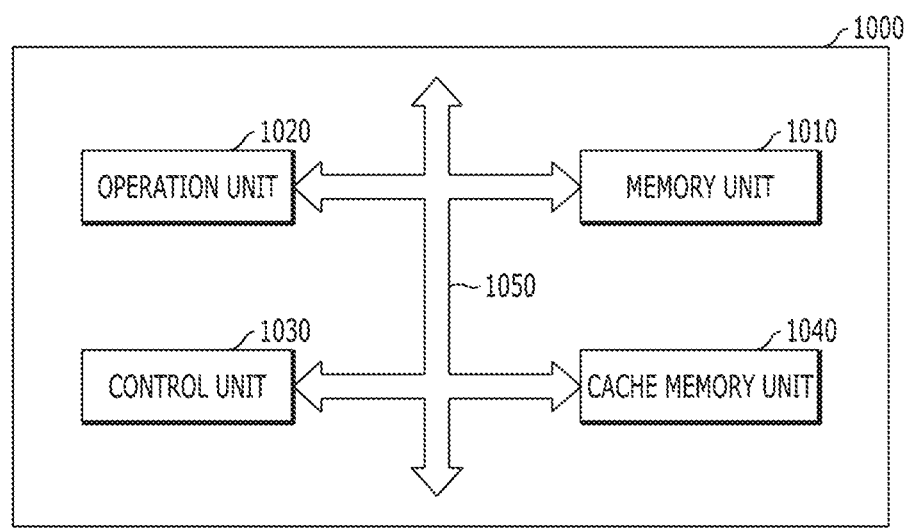
FIG. 7 is an example of configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to this implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
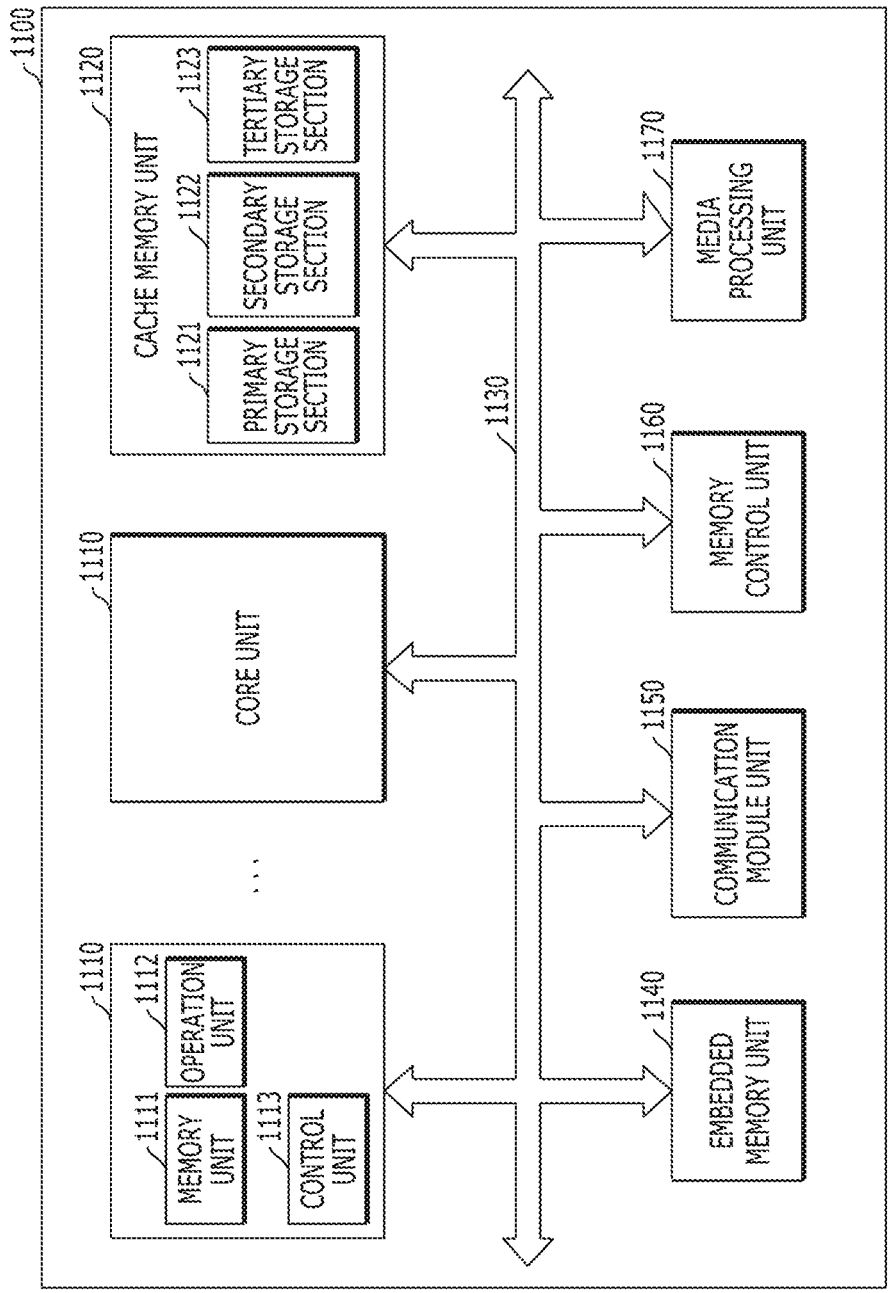
FIG. 8 is an example of configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to this implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to this implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
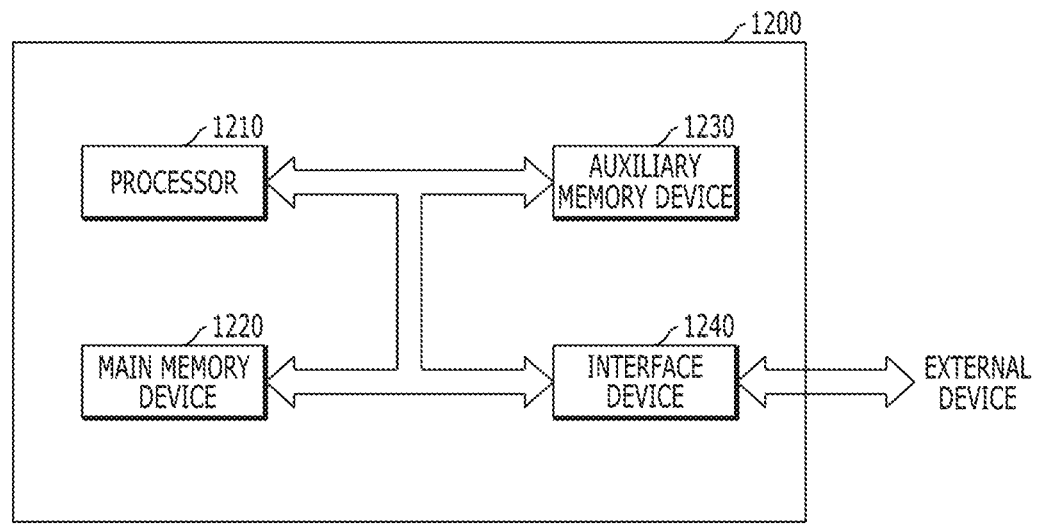
FIG. 9 is an example of configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of this implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of this implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
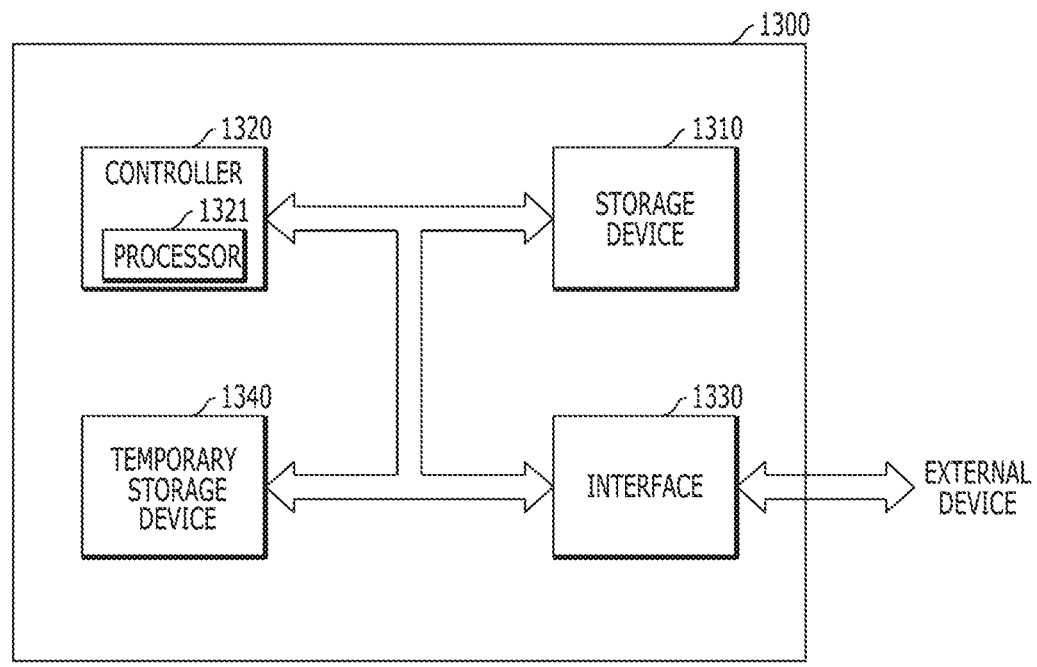
FIG. 10 is an example of configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the storage device 1310 or the temporary storage device 1340 may be improved. As a consequence, operating characteristics and data storage characteristics of the data storage system 1300 may be improved.

Figure 11:
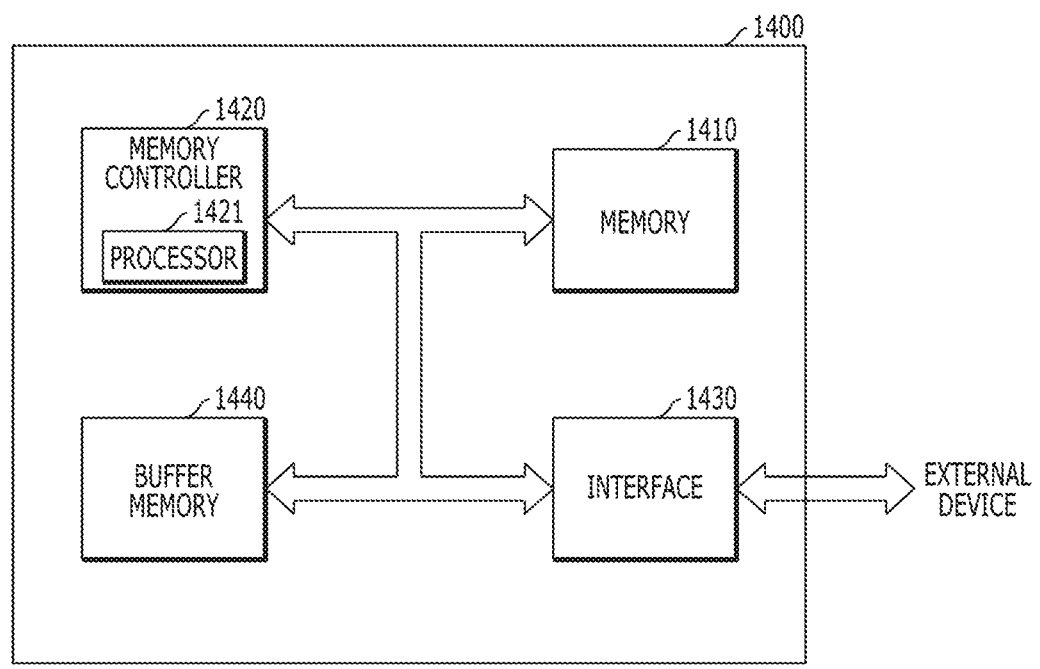
FIG. 11 is an example of configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the memory 1410 may be improved. As a consequence, operating characteristics and data storage characteristics of the memory system 1400 may be improved.

Also, the memory 1410 according to this implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to this implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include may include one or more variable resistance elements, wherein each variable resistance element may include a Magnetic Tunnel Junction (MTJ) structure including a free layer having a changeable magnetization direction, a pinned layer having a fixed magnetization direction and a tunnel barrier layer interposed between the free layer and the pinned layer; and a sidewall spacer disposed on a sidewall of the variable resistance element and including an amorphous silicon. Through this, data storage characteristics of the buffer memory 1440 may be improved. As a consequence, operating characteristics and data storage characteristics of the memory system 1400 may be improved.

Moreover, the buffer memory 1440 according to this implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, wherein the semiconductor memory comprises one or more variable resistance elements,
    wherein each variable resistance element comprises:
        a Magnetic Tunnel Junction (MTJ) structure including a free layer having a changeable magnetization direction, a pinned layer having a fixed magnetization direction and a tunnel barrier layer interposed between the free layer and the pinned layer;
        a sidewall spacer disposed on a sidewall of the variable resistance element and including a boron-doped amorphous silicon;
        a first additional sidewall spacer disposed between the sidewall spacer and the variable resistance element and including a metal oxide;
        a second additional sidewall spacer disposed between the sidewall spacer and the first additional sidewall spacer and including a silicon oxide, a silicon nitride or a combination of the silicon oxide and the silicon nitride; and
        a protective layer disposed on the sidewall spacer and including an insulating material, and
        wherein the variable resistance element has a boron content in sidewalls due to a presence of boron ions in the boron-doped amorphous silicon included in the sidewall spacer.

2. The electronic device of claim 1, wherein the amorphous silicon is a low temperature amorphous silicon which is deposited at a temperature from 150° C. to 400° C.

3. The electronic device of claim 1, wherein the semiconductor memory further includes a first additional sidewall spacer disposed between the sidewall spacer and the variable resistance element and including a metal oxide.

4. The electronic device of claim 3, wherein the metal oxide includes an oxide of a metal including Hf, Fe, Al, Mg, Zr, Nb, Mo, Ta, W, or Ti, or a combination thereof.

5. The electronic device of claim 3, wherein the semiconductor memory further includes a second additional sidewall spacer disposed between the sidewall spacer and the first additional sidewall spacer and including a silicon oxide, a silicon nitride or a combination thereof.

6. The electronic device of claim 1, wherein the semiconductor memory further includes another sidewall spacer disposed between the sidewall spacer and the variable resistance element and including a silicon-containing metal oxide.

7. The electronic device of claim 6, wherein the silicon-containing metal oxide includes a metal including Hf, Fe, Al, Mg, Zr, Nb, Mo, Ta, W, or Ti, or a combination thereof.

8. The electronic device of claim 1, wherein the variable resistance element further includes a lower electrode disposed at a lowest portion of the variable resistance element, and
    the lower electrode includes an upper portion and a lower portion, the upper portion having sidewalls which are aligned with the MTJ structure and the lower portion having a greater width than a width of the upper portion and having sidewalls which are not aligned with the upper portion.

9. An electronic device comprising a semiconductor memory, wherein the semiconductor memory comprises:
    a substrate;
    a first magnetic layer disposed over the substrate;
    a tunnel barrier layer disposed over the first magnetic layer;
    a second magnetic layer disposed over the tunnel barrier layer;
    a first sidewall spacer disposed on sidewalls of the first magnetic layer, the tunnel barrier layer and the second magnetic layer;
    a second sidewall spacer disposed on the first sidewall spacer; and
    a third sidewall spacer disposed on the second sidewall spacer and structured to exhibit a compressive stress of 0.5 to 1.5 GPa;
    a protective layer disposed on the third sidewall spacer and including an insulating material, and
    wherein the third sidewall spacer includes a boron-doped amorphous silicon and the variable resistance element has a boron content in sidewalls due to a presence of boron ions in the boron-doped amorphous silicon included in the third sidewall spacer.

10. The electronic device of claim 9, wherein the first sidewall spacer includes a metal oxide or a silicon-containing metal oxide.

11. The electronic device of claim 10, wherein the first sidewall spacer includes a metal including Hf, Fe, Al, Mg, Zr, Nb, Mo, Ta, W, or Ti, or a combination.

12. The electronic device of claim 9, wherein the second sidewall spacer includes a silicon oxide, or a silicon nitride or a combination thereof.

13. The electronic device of claim 9, wherein the third sidewall spacer includes a low temperature amorphous silicon which is deposited at a temperature from 150° C. to 400° C.

14. The electronic device of claim 13, wherein the third sidewall spacer includes a boron-doped amorphous silicon or a germanium-inserted amorphous silicon.

15. The electronic device of claim 14, wherein the first magnetic layer, the tunnel barrier layer and the second magnetic layer have a boron content which increases from a center portion toward a sidewall.

16. The electronic device of claim 9, wherein a direction of magnetic anisotropy in the sidewalls of the first magnetic layer, the tunnel barrier layer and the second magnetic layer is parallel to an interface of the layers due to a high compressive stress of the third sidewall spacer.

* * * * *